US007075829B2

(12) United States Patent
Forbes

(10) Patent No.: US 7,075,829 B2
(45) Date of Patent: Jul. 11, 2006

(54) PROGRAMMABLE MEMORY ADDRESS AND DECODE CIRCUITS WITH LOW TUNNEL BARRIER INTERPOLY INSULATORS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 09/945,500

(22) Filed: Aug. 30, 2001

(65) Prior Publication Data

US 2003/0043632 A1 Mar. 6, 2003

(51) Int. Cl.
*G11C 16/04* (2006.01)
*H01L 29/06* (2006.01)
*H01L 21/335* (2006.01)
*H01L 21/336* (2006.01)
*H01L 21/338* (2006.01)

(52) U.S. Cl. .................. 365/185.28; 365/185.05; 365/185.26; 257/17; 257/135; 257/302; 438/156; 438/157; 438/175; 438/176; 438/206; 438/263; 438/268; 438/270; 438/282

(58) Field of Classification Search ............ 365/185.01, 365/185.23, 185.28, 185.26, 185.05, 185.06; 257/17, 135, 302, 220; 438/156, 157, 175, 438/176, 206, 263, 268, 270, 282, 212
See application file for complete search history.

(56) References Cited

U.S. PATENT DOCUMENTS

| 3,978,577 A | 9/1976 | Bhattacharyya et al. ...... 29/571 |
| 4,295,150 A | 10/1981 | Adam ........................... 357/54 |
| 4,412,902 A | 11/1983 | Michikami et al. ......... 204/192 |
| 4,449,205 A | 5/1984 | Hoffman ..................... 365/182 |
| 4,495,219 A | 1/1985 | Kato et al. .................... 427/82 |
| 4,556,975 A | 12/1985 | Smith et al. |
| 4,672,240 A | 6/1987 | Smith et al. |
| 4,688,078 A | 8/1987 | Hseih .......................... 257/321 |
| 4,717,943 A | 1/1988 | Wolf et al. ................. 357/23.5 |
| 4,757,360 A | 7/1988 | Faraone et al. ............. 257/317 |
| 4,780,424 A | 10/1988 | Holler et al. ................. 437/29 |
| 4,794,565 A | 12/1988 | Wu et al. .................... 365/185 |
| 4,870,470 A | 9/1989 | Bass, Jr. et al. ........... 357/23.5 |

(Continued)

OTHER PUBLICATIONS

Bhattacharyya, A., "Physical & Electrical Characteristics of LPCVD Silicon Rich Nitride", *ECS Technical Digest, J. Electrochem. Soc.,* 131(11), 691 RDP, New Orleans,(1984),469C.

(Continued)

*Primary Examiner*—Amir Zarabian
*Assistant Examiner*—Ly Duy Pham
(74) *Attorney, Agent, or Firm*—Schwegman, Lundberg, Woessner & Kluth, P.A.

(57) ABSTRACT

Structures and methods for programmable memory address and decode circuits with low tunnel barrier interpoly insulators are provided. The decoder for a memory device includes a number of address lines and a number of output lines wherein the address lines and the output lines form an array. A number of logic cells are formed at the intersections of output lines and address lines. Each of the logic cells includes a floating gate transistor which includes a first source/drain region and a second source/drain region separated by a channel region in a substrate. A floating gate opposes the channel region and is separated therefrom by a gate oxide. A control gate opposing the floating gate. The control gate is separated from the floating gate by a low tunnel barrier intergate insulator. The low tunnel barrier intergate insulator includes a metal oxide insulator selected from the group consisting of PbO, $Al_2O_3$, $Ta_2O_5$, $TiO_2$, $ZrO_2$, $Nb_2O_5$ and/or a Perovskite oxide tunnel barrier.

31 Claims, 17 Drawing Sheets

U.S. PATENT DOCUMENTS

| | | | |
|---|---|---|---|
| 4,939,559 A | 7/1990 | DiMaria et al. | 257/38 |
| 5,042,011 A | 8/1991 | Casper et al. | 365/205 |
| 5,071,782 A | 12/1991 | Mori | 437/48 |
| 5,073,519 A | 12/1991 | Rodder | 438/269 |
| 5,153,880 A | 10/1992 | Owen et al. | |
| 5,280,205 A | 1/1994 | Green et al. | 307/530 |
| 5,350,738 A | 9/1994 | Hase et al. | 505/473 |
| 5,353,431 A | 10/1994 | Doyle et al. | |
| 5,399,516 A | 3/1995 | Bergendahl et al. | 437/43 |
| 5,418,389 A | 5/1995 | Watanabe | 257/295 |
| 5,445,984 A | 8/1995 | Hong et al. | 437/43 |
| 5,455,792 A | 10/1995 | Yi | 365/185.12 |
| 5,474,947 A | 12/1995 | Chang et al. | 438/257 |
| 5,488,612 A | 1/1996 | Heybruck | 714/725 |
| 5,497,494 A | 3/1996 | Combs et al. | 395/750 |
| 5,498,558 A | 3/1996 | Kapoor | 437/43 |
| 5,508,544 A | 4/1996 | Shah | 257/316 |
| 5,510,278 A | 4/1996 | Nguyen et al. | 437/40 |
| 5,600,592 A | 2/1997 | Atsumi et al. | 365/185.18 |
| 5,617,351 A | 4/1997 | Bertin et al. | 365/185.05 |
| 5,618,575 A | 4/1997 | Peter | 427/8 |
| 5,619,642 A | 4/1997 | Nielsen et al. | 395/182.04 |
| 5,627,785 A | 5/1997 | Gilliam et al. | 365/189.01 |
| 5,646,430 A | 7/1997 | Kaya et al. | 257/322 |
| 5,677,867 A | 10/1997 | Hazani | 365/185 |
| 5,691,209 A * | 11/1997 | Liberkowski | 438/10 |
| 5,691,230 A | 11/1997 | Forbes | 437/62 |
| 5,739,544 A * | 4/1998 | Yuki et al. | 257/25 |
| 5,801,401 A | 9/1998 | Forbes | 257/77 |
| 5,852,306 A | 12/1998 | Forbes | 257/315 |
| 5,880,991 A | 3/1999 | Hsu et al. | 365/182 |
| 5,923,056 A | 7/1999 | Lee et al. | 257/192 |
| 5,936,274 A | 8/1999 | Forbes et al. | 257/315 |
| 5,952,692 A | 9/1999 | Nakazato et al. | 257/321 |
| 5,959,465 A | 9/1999 | Beat | 326/39 |
| 5,981,350 A | 11/1999 | Geusic et al. | 438/386 |
| 5,986,932 A | 11/1999 | Ratnakumar et al. | 365/185.07 |
| 5,991,225 A * | 11/1999 | Forbes et al. | 365/230.06 |
| 6,009,011 A | 12/1999 | Yamauchi | 365/185.01 |
| 6,025,228 A | 2/2000 | Ibok et al. | 438/261 |
| 6,025,627 A | 2/2000 | Forbes et al. | 257/321 |
| 6,031,263 A | 2/2000 | Forbes et al. | 257/315 |
| 6,069,380 A | 5/2000 | Chou et al. | 257/315 |
| 6,069,816 A | 5/2000 | Nishimura | 365/145 |
| 6,077,745 A * | 6/2000 | Burns et al. | 438/270 |
| 6,101,131 A | 8/2000 | Chang | 365/185.33 |
| 6,124,729 A | 9/2000 | Noble et al. | 326/41 |
| 6,127,227 A | 10/2000 | Lin et al. | 438/261 |
| 6,134,175 A | 10/2000 | Forbes et al. | 365/230.06 |
| 6,135,175 A | 10/2000 | Gaudreault et al. | 144/4.1 |
| 6,141,238 A | 10/2000 | Forbes et al. | 365/145 |
| 6,141,248 A | 10/2000 | Forbes et al. | 365/185.08 |
| 6,143,636 A | 11/2000 | Forbes et al. | 438/587 |
| 6,153,468 A | 11/2000 | Forbes et al. | 438/257 |
| 6,163,049 A | 12/2000 | Bui | 257/321 |
| 6,169,306 B1 | 1/2001 | Gardner et al. | 257/317 |
| 6,208,164 B1 | 3/2001 | Noble et al. | 326/41 |
| 6,210,999 B1 | 4/2001 | Gardner et al. | 438/183 |
| 6,229,175 B1 | 5/2001 | Uchida | 257/315 |
| 6,238,976 B1 | 5/2001 | Noble et al. | 438/259 |
| 6,246,606 B1 | 6/2001 | Forbes et al. | 365/185.03 |
| 6,249,020 B1 | 6/2001 | Forbes et al. | 257/315 |
| 6,249,460 B1 | 6/2001 | Forbes et al. | 365/185.03 |
| 6,288,419 B1 | 9/2001 | Prall et al. | 257/213 |
| 6,306,708 B1* | 10/2001 | Peng | 438/266 |
| 6,307,775 B1 | 10/2001 | Forbes et al. | 365/185.01 |
| 6,317,364 B1 | 11/2001 | Guterman et al. | 365/185.28 |
| 6,323,844 B1 | 11/2001 | Yeh et al. | 345/166 |
| 6,341,084 B1 | 1/2002 | Numata et al. | 365/158 |
| 6,351,411 B1 | 2/2002 | Forbes et al. | 365/182 |
| 6,377,070 B1 | 4/2002 | Forbes | 326/41 |
| 6,424,001 B1 | 7/2002 | Forbes et al. | 257/315 |
| 6,433,382 B1* | 8/2002 | Orlowski et al. | 257/315 |
| 6,440,801 B1* | 8/2002 | Furukawa et al. | 438/272 |
| 6,461,931 B1 | 10/2002 | Eldridge | 438/398 |
| 6,475,857 B1 | 11/2002 | Kim et al. | 438/240 |
| 6,476,434 B1* | 11/2002 | Noble et al. | 257/302 |
| 6,504,207 B1 | 1/2003 | Chen et al. | |
| 6,514,842 B1 | 2/2003 | Prall et al. | 438/593 |
| 6,541,280 B1 | 4/2003 | Kaushik et al. | |
| 6,566,682 B1* | 5/2003 | Forbes | 257/51 |
| 6,574,143 B1 | 6/2003 | Nakazato | |
| 6,586,797 B1 | 7/2003 | Forbes et al. | 257/325 |
| 6,730,575 B1 | 5/2004 | Eldridge | 257/310 |
| 6,740,928 B1 | 5/2004 | Yoshii et al. | |
| 6,754,108 B1 | 6/2004 | Forbes | 365/185.25 |
| 6,903,367 B1* | 6/2005 | Forbes | 257/51 |
| 6,950,340 B1 | 9/2005 | Bhattacharyya | |
| 6,952,032 B1 | 10/2005 | Forbes et al. | |
| 2001/0013621 A1* | 8/2001 | Nakazato | 257/314 |
| 2001/0055838 A1* | 12/2001 | Walkar et al. | 438/129 |
| 2002/0028541 A1* | 3/2002 | Lee et al. | 438/149 |
| 2002/0106536 A1 | 8/2002 | Lee et al. | 428/702 |
| 2002/0137250 A1 | 9/2002 | Nguyen et al. | 438/53 |
| 2003/0042527 A1 | 3/2003 | Forbes et al. | 257/315 |
| 2003/0042532 A1 | 3/2003 | Forbes | 257/316 |
| 2003/0043622 A1 | 3/2003 | Forbes | 365/185.05 |
| 2003/0043630 A1 | 3/2003 | Forbes et al. | 365/185.26 |
| 2003/0043632 A1 | 3/2003 | Forbes | 365/185.28 |
| 2003/0043633 A1 | 3/2003 | Forbes et al. | 365/185.28 |
| 2003/0043637 A1 | 3/2003 | Forbes et al. | 365/185.33 |
| 2003/0045082 A1 | 3/2003 | Eldridge et al. | 438/593 |
| 2003/0048666 A1 | 3/2003 | Eldridge et al. | 365/185.28 |
| 2004/0004245 A1 | 1/2004 | Forbes et al. | 257/315 |
| 2004/0004247 A1 | 1/2004 | Forbes et al. | 257/234 |
| 2004/0004859 A1 | 1/2004 | Forbes et al. | 365/185.05 |
| 2005/0169054 A1 | 8/2005 | Forbes | |

OTHER PUBLICATIONS

Han, Kwangseok, "Characteristics of P-Channel Si Nano-Crystal Memory", *IEDM Technical Digest, International Electron Devices Meeting*, (Dec. 10-13, 2000),309-312.

Inumiya, S , et al., "Conformable formation of high quality ultra-thin amorphous Ta2 O5 gate dielectrics utilizing water assisted deposition (WAD) for sub 50nm damascene metal gate MOSFETs", *IEDM Technical Digest. International Electron Devices Meeting*, (Dec. 10-13, 2000),649-652.

Manchanda, L. , "Si-doped aluminates for high temperature metal-gate CMOS: Zr—Al—Si—O, a novel gate dielectric for low power applicatons", *IEDM Technical Digest. International Electron Devices Meeting*, (Dec. 10-13, 2000),23-26.

Shi, Y. , "Tunneling Leakage Current in Ultrathin (<4nm) Nitride/Oxide Stack Dielectrics", *IEEE Electron Device Letters*, 19(10), (1998),pp. 388-390.

Yamaguchi, Takeshi, "Band Diagram and Carrier Conduction Mechanism in ZrO2/Zr-silicate/Si MIS Structure Fabricated by Pulsed-laser-ablation Deposition", *Electron Devices Meeting, 2000, IEDM Technical Digest. International*, (2000),19-22.

Zhang, H. , et al., "Atomic Layer Deposition of High Dielectric Constant Nanolaminates", *Journal of The Electrochemical Society*, 148(4),(2001),F63-F66.

Aarik, Jaan, et al., "Anomalous effect of temperature on atomic layer deposition of titanium oxide", *Journal of Crystal Growth*, (2000),pp. 531-537.

Aarik, Jaan , et al., "Texture developnment in nanocrystalline hafnium dioxide thin films grown by atomic layer deposition", *Journal of Crystal Growth*, (2000),pp. 105-113.

Ferguson, J D., et al., "Atomic layer deposition of Al2O3 and SiO2 on BN particles using sequential surface reaction", *Applied Surface Science*, (2000),pp. 280-292.

Kim, Young S., et al., "Effect of rapid thermal annealing on the structure and the electrical properties of atomic-layer-deposited Ta2O5 films", *Journal of the Korean Physical Society*, (Dec. 2000),pp. 975-979.

Kim, Yeong K., et al., "Novel capacitor technology for high density stand-alone and embedded DRAMs", *IEEE*, (2000),4 pages.

Kukli, Kaupo, "Atomic Layer Depositon of Titanium Oxide from TiI4 and H2O2", *Chemical Vapor Deposition*, (2000),pp. 303-310.

Kukli, Kaupo , et al., "Atomic layer deposition of zirconium oxide from zirconium tetraiodide, water and hydrogen peroxide", *Journal of Crystal Growth*, (2001),pp. 262-272.

Kukli, Kaupo , et al., "Real-time monitoring in atomic layer deposition of TiO2 from TiI4and H2O—H2O2", *American Chemical Society*, (2000),pp. 8122-8128.

Lee, J. , "Effect of Polysilicon Gate on the Flatband Voltage Shift and Mobility Degradation for ALD-Al2O3 Gate Dielectric", *IEDM*, (2000),pp. 645-648.

Paranjpe, Ajit , et al., "Atomic layer deposition of AlOx for thin film head gap application", *Journal of the Electrochemical Society*, (Sep. 2001),pp. 465-471.

Smith, Ryan C., et al., "Chemical vapour deposition of the oxides of titanium, zirconium and hafnium for use as high-k materials in microelectronic devices. A carbon-free precursor for the synthesis if hafnium dioxide", *Advanced Materials for Optics and Electronics*, (2000),2 pages.

Arya, S., "Conduction Properties of Thin Al2O3 Films", *Thin Solid Films, 91*, (1982),pp. 363-374.

Dipert, B., "Flash Memory Goes Mainstream", *IEEE Spectrum, 30*, (Oct. 1993),48-52.

Eldridge, J.M. ,"Growth of Thin PbO Layers on Lead Films", *Surgace Science, 40*, (1973),pp. 512-530.

Eldridge, J.,"Measurement of Tunnel Current Density in a Metal-Oxide-Metal System as a Function of Oxide Thickness", *Proc. 12th Intern. Conf. on Low Temperature Physics*, (1971),pp. 427-428.

Greiner, J.G. ,"Josephson Tunneling Barriers by rf Sputter Etching in an Oxygen Plasma", *Journal of Applied Physics, vol. 42, No. 12*, (Nov. 1971),5151-5155.

Greiner, J.,"Oxidation of lead films by rf sputter etching in an oxygen plasma", *Journal of Applied Physics, 45(1)*, (1974),pp. 32-37.

Grimbolt, J.,"I. Interaction of Al Films with O2 at Low Pressures", *Journal of the Electrochemical Society, 129(10)*, (1982),pp. 2366-2368.

Grimbolt, J.,"II. Oxidation of Al Films", *Journal of Electrochem Soc.: Solid-State Science and Technology*, (1982),pp. 2369-2372.

Gundlach, K., "Logarithmic Conductivity of Al—Al2O3—Al Tunneling Junctions Produced by Plasma and by Thermal Oxidation", *Surface Science, 27*, (1971),pp. 125-141.

Hodges, D.A. , *Analysis and Design of Digital Integrated Circuits, 2nd Edition*, McGraw-Hill Publishing. New York, (1988),pp. 354-357.

Hurych, Z., "Influence of Non-Uniform Thickness of Dielectric Layers on Capacitance and Tunnel Currents", *Solid-State Electronics, vol. 9*, (1966),967-979.

Kubaschewski, O., *Oxidation of Metals and Alloys*, Butterworths, London,(1962),pp. 53-63.

Luan, H., "High Technology Ta2O5 Gate Dielectrics with Tox,eq<10A", *IEDM*, (1999),pp. 141-144.

Masuoka, Fujio.,"A 256K flash EEPROM using Triple Polysilicon Technology", *1985 IEEE International Solid-State Circuits Conference. Digest of Technical Papers*, (1985), 168-169.

Masuoka, Fujio.,"A new Flash E2PROM Cell using Triple Polysilicon Technology", *International Electron Devices Meeting. Technical Digest*, (1984),464-467.

Mori, S.,"Reliable CVD Inter-Poly Dielectrics for Advanced E&EEPROM", *1985 Symposium on VSLI Technology. Digest of Technical Papers*, (1985),pp. 16-17.

Pashley, Richard.D. , "Flash Memories: the best of two worlds", *IEEE Spectrum*, (1989),30-33.

Pollack, S.,"Tunneling Through Gaseous Oxidized Films of Al2O3", *Transactions of the Metallurgical Society of AIME, 233*, (1965),pp. 497-501.

Shi, Y.,"Tunneling Leakage Current in Ultrathin (<4 nm) Nitride/Oxide Stack Dielectrics", *IEEE Electron Device Letters, 19(10)*, (1998),pp. 388-390.

Simmons, J.,"Generalized Formula for the Electric Tunnel Effect between Similiar Electrodes Separated by a Thin Insulating Film", *Journal of Applied Physics, 34(6)*, (1963),pp. 1793-1803.

Sze, S., *Physics of Semiconductor Devices, Second Edition*, John Wiley & Sons, New York,(1981),pp. 553-556.

Afanas'ev, V , et al., "Electron energy barriers between (100)Si and ultrathin stacks of SiO2, Al2O3, and ZrO3 and ZrO2 insulators", *Applied Physics Letters, 78(20)*, (2001), pp. 3073-3075.

Eierdal, L. , et al., "Interaction of oxygen with Ni(110) studied by scanning tunneling microscopy", *Surface Science, 312*, (1994),pp. 31-53.

Eldridge, J. , et al., "Analysis of Ultrathin Oxide Growth on Indium", *Thin Solid Films, 12*, (1972), pp. 447-451.

Guo, X. , "High Quality Ultra-thin (1.5 nm) TiO2/Si3N4 Gate Dielectric for Deep Sub-micron CMOS Technology", *IEDM Technical Digest*, (1999), pp. 137-140.

Hodges, D. A., et al., *Analysis and Design of Digital Integrated Circuits*, McGraw-Hill Book Company, 2nd Edition, (1988), pp. 394-396.

Itokawa, H , "Determination of Bandgap and Energy Band Alignment for High-Dielectric-Constant Gate Insulators Using High-Resolution X-ray Photoelectron Spectroscopy", *Extended Abstracts of the 1999 International Conference on Solid State Devices and MAterials*, (1999), pp. 158-159.

Kim, H. , "Leakage current and electrical breakdown in metal-organic chemical vapor deposited TiO2 dielectrics on silicon substrates", *Applied Phys. Lett., 69(25)*, (1996), pp. 3860-3862.

Kubaschewski, O. , et al., *Oxidation of Metals and Alloys, Second Edition*, Butterworths, London, (1962), pp. 1-3, 5,6, 8-12, 24, 36-39.

Kukli, K. , "Development of Dielectric Properties of Niobium Oxide, Tantalum Oxide, and Aluminum Oxide Based Nanolayered Materials", *Journal of the Electrochemical Society, 148(2)*, (2001), pp. F35-F41.

Kwo, J. , "Properties of high k gate dielectrics Gd2O3 and Y2O3 for Si", *Journal of Applied Physics, 89(7)*, (2001),pp. 3920-3927.

Ma, Y. , "Zirconium Oxide Based Gate Dielectrics with equivalents Oxide Thickness of LEss Than 1.0 nm and Performance of Submicron MOSFET using a Nitride Gate Replacement Process", *IEDM—Technical Digest*, (1999), pp. 149-152.

Marshalek, R., et al., "Photoresponse Characteristics of Thin-Film Nickel—Nickel Oxide-Nickel Tunneling Junctions", *IEEE Journal of Quantum Electronics, QE-19(4)*, pp. 749-754.

Muller, H., "Electrical and Optical Properties of Sputtered In2O3 Films", *Physica Status Solidi, 27(2)*, (1968), pp. 723-731.

Qi, W, "MOSCAP and MOSFET characteristics using ZrO2 gate dielectric deposited directly on Si", *IEDM—Technical Digest*, (1999), pp. 145-148.

Robertson, J., "Band offsets of wide-band-gap oxides and implications for future electronic devices", *Journal Vac. Sci. Technol. B, 18(3)*, (2000), pp. 1785-1791.

Robertson, J., et al., "Schottky Barrier height of Tantalum oxide, barium strontium titanate, lead titanate, and strontium bismuth tantalate", *Applied Physics Letters, vol. 74, No. 8*, (Feb. 22, 1999), pp. 1168-1170.

Swalin, R., "Equilibrium between Phases of Variable Composition", *Thermodynamics of Solids, 2nd Edition*, (1972), pp. 165-180.

Yan, J., et al., "Structural and electrical characterization of TiO2 grown from titanium tetrakis-isopropoxide (TTIP) and TTIP/H2O ambients", *Journal Vac. Sci. Tachnol. B, 14(3)*, (1996), pp. 1706-1711.

\* cited by examiner

PROGRAMMABLE MEMORY ADDRESS AND DECODE CIRCUITS WITH LOW TUNNEL BARRIER INTERPOLY INSULATORS

CROSS REFERENCE TO RELATED APPLICATIONS

This application is related to the following co-pending, commonly assigned U.S. patent applications: "DRAM Cells with Repressed Memory Metal Oxide Tunnel Insulators," Ser. No. 09/945,395, "Programmable Array Logic or Memory Devices with Asymmetrical Tunnel Barriers," Ser. No. 09/943,134, "Dynamic Electrically Alterable Programmable Memory with Insulating Metal Oxide Interpoly Insulators," Ser. No. 09/945,498, and "Flash Memory with Low Tunnel Barrier Interpoly Insulators," Ser. No. 09/945,507, "SRAM Cells with Repressed Floating Gate Memory, Metal Oxide Tunnel Interpoly Insulators," Ser. No. 09/945,554, which are filed on even date herewith and each of which disclosure is herein incorporated by reference.

FIELD OF THE INVENTION

The present invention relates generally to integrated circuits, and in particular to in-service programmable logic arrays with low tunnel barrier interpoly insulators.

BACKGROUND OF THE INVENTION

Logic circuits are an integral part of digital systems, such as computers. Essentially, a logic circuit processes a number of inputs to produce a number of outputs for use by the digital system. The inputs and outputs are generally electronic signals that take on one of two "binary" values, a "high" logic value or a "low" logic value. The logic circuit manipulates the inputs using binary logic which describes, in a mathematical way, a given or desired relationship between the inputs and the outputs of the logic circuit.

Logic circuits that are tailored to the specific needs of a particular customer can be very expensive to fabricate on a commercial basis. Thus, general purpose very large scale integration (VLSI) circuits are defined. VLSI circuits serve as many logic roles as possible, which helps to consolidate desired logic functions. However, random logic circuits are still required to tie the various elements of a digital system together.

Several schemes are used to implement these random logic circuits. One solution is standard logic, such as transistor-transistor logic (TTL). TTL integrated circuits are versatile because they integrate only a relatively small number of commonly used logic functions. The drawback is that large numbers of TTL integrated circuits are typically required for a specific application. This increases the consumption of power and board space, and drives up the overall cost of the digital system.

One alternative to standard logic is fully custom logic integrated circuits. Custom logic circuits are precisely tailored to the needs of a specific application. This allows the implementation of specific circuit architectures that dramatically reduces the number of parts required for a system. However, custom logic devices require significantly greater engineering time and effort, which increases the cost to develop these circuits and may also delay the production of the end system.

A less expensive alternative to custom logic is the "programmable logic array." Programmable logic arrays take advantage of the fact that complex combinational logic functions can be reduced and simplified into various standard forms. For example, logical functions can be manipulated and reduced down to traditional Sum of Products (SOP) form. In SOP form, a logical function uses just two types of logic functions that are implemented sequentially. This is referred to as two-level logic and can be implemented with various conventional logic functions, e.g., AND-OR, NAND-NAND, NOR-NOR.

One benefit of the programmable logic array is that it provides a regular, systematic approach to the design of random, combinational logic circuits. A multitude of logical functions can be created from a common building block, e.g., an array of transistors. The logic array is customized or "programmed" by creating a specific metallization pattern to interconnect the various transistors in the array to implement the desired function.

Programmable logic arrays are fabricated using photolithographic techniques that allow semiconductor and other materials to be manipulated to form integrated circuits as is known in the art. These photolithographic techniques essentially use light that is focused through lenses and masks to define patterns in the materials with microscopic dimensions. The equipment and techniques that are used to implement this photolithography provide a limit for the size of the circuits that can be formed with the materials. Essentially, at some point, the lithography cannot create a fine enough image with sufficient clarity to decrease the size of the elements of the circuit. In other words, there is a minimum dimension that can be achieved through conventional photolithography. This minimum dimension is referred to as the "critical dimension" (CD) or minimum "feature size" (F) of the photolithographic process. The minimum feature size imposes one constraint on the size of the components of a programmable logic array. In order to keep up with the demands for larger programmable logic arrays, designers search for ways to reduce the size of the components of the array.

As the density requirements become higher and higher in logic and memories it becomes more and more crucial to minimize device area. The programmable logic array (PLA) circuit in the NOR-NOR configuration is one example of an architecture for implementing logic circuits.

Flash memory cells are one possible solution for high density memory requirements. Flash memories include a single transistor, and with high densities would have the capability of replacing hard disk drive data storage in computer systems. This would result in delicate mechanical systems being replaced by rugged, small and durable solid-state memory packages, and constitute a significant advantage in computer systems. What is required then is a flash memory with the highest possible density or smallest possible cell area.

Flash memories have become widely accepted in a variety of applications ranging from personal computers, to digital cameras and wireless phones. Both INTEL and AMD have separately each produced about one billion integrated circuit chips in this technology.

The original EEPROM or EARPROM and flash memory devices described by Toshiba in 1984 used the interploy dielectric insulator for erase. (See generally, F. Masuoka et al., "A new flash EEPROM cell using triple polysilicon technology," IEEE Int. Electron Devices Meeting, San Francisco, pp. 464–67, 1984; F. Masuoka et al., "256K flash EEPROM using triple polysilicon technology," IEEE Solid-State Circuits Conf., Philadelphia, pp. 168–169, 1985).

Various combinations of silicon oxide and silicon nitride were tried. (See generally, S. Mori et al., "reliable CVD inter-poly dialectics for advanced E&EEPROM," Symp. On VLSI Technology, Kobe, Japan, pp. 16–17, 1985). However, the rough top surface of the polysilicon floating gate resulted in, poor quality interpoly oxides, sharp points, localized high electric fields, premature breakdown and reliability problems.

Widespread use of flash memories did not occur until the introduction of the ETOX cell by INTEL in 1988. (See generally, U.S. Pat. No. 4,780,424, "Process for fabricating electrically alterable floating gate memory devices," Oct. 25, 1988; B. Dipert and L. Hebert, "Flash memory goes mainstream," IEEE Spectrum, pp. 48–51, October, 1993; R. D. Pashley and S. K. Lai, "Flash memories, the best of two worlds," IEEE Spectrum, pp. 30–33, December 1989). This extremely simple cell and device structure resulted in high densities, high yield in production and low cost. This enabled the widespread use and application of flash memories anywhere a non-volatile memory function is required. However, in order to enable a reasonable write speed the ETOX cell uses channel hot electron injection, the erase operation which can be slower is achieved by Fowler-Nordhiem tunneling from the floating gate to the source. The large barriers to electron tunneling or hot electron injection presented by the silicon oxide-silicon interface, 3.2 eV, result in slow write and erase speeds even at very high electric fields. The combination of very high electric fields and damage by hot electron collisions in the oxide result in a number of operational problems like soft erase error, reliability problems of premature oxide breakdown and a limited number of cycles of write and erase.

Other approaches to resolve the above described problems include; the use of different floating gate materials, e.g. SiC, SiOC, GaN, and GaAlN, which exhibit a lower work function (see FIG. 1A), the use of structured surfaces which increase the localized electric fields (see FIG. 1B), and amorphous SiC gate insulators with larger electron affinity, $\chi$, to increase the tunneling probability and reduce erase time (see FIG. 1C).

One example of the use of different floating gate (FIG. 1A) materials is provided in U.S. Pat. No. 5,801,401 by L. Forbes, entitled "FLASH MEMORY WITH MICROCRYSTALLINE SILICON CARBIDE AS THE FLOATING GATE STRUCTURE." Another example is provided in U.S. Pat. No. 5,852,306 by L. Forbes, entitled "FLASH MEMORY WITH NANOCRYSTALLINE SILICON FILM AS THE FLOATING GATE." Still further examples of this approach are provided in pending applications by L. Forbes and K. Ahn, entitled "DYNAMIC RANDOM ACCESS MEMORY OPERATION OF A FLASH MEMORY DEVICE WITH CHARGE STORAGE ON A LOW ELECTRON AFFINITY GaN OR GaAlN FLOATING GATE," Ser. No. 08/908,098, and "VARIABLE ELECTRON AFFINITY DIAMOND-LIKE COMPOUNDS FOR GATES IN SILICON CMOS MEMORIES AND IMAGING DEVICES," Ser. No. 08/903,452.

An example of the use of the structured surface approach (FIG. 1B) is provided in U.S. Pat. No. 5,981,350 by J. Geusic, L. Forbes, and K. Y. Ahn, entitled "DRAM CELLS WITH A STRUCTURE SURFACE USING A SELF STRUCTURED MASK." Another example is provided in U.S. Pat. No. 6,025,627 by L. Forbes and J. Geusic, entitled "ATOMIC LAYER EXPITAXY GATE INSULATORS AND TEXTURED SURFACES FOR LOW VOLTAGE FLASH MEMORIES."

Finally, an example of the use of amorphous SiC gate insulators (FIG. 1C) is provided in U.S. patent application Ser. No. 08/903,453 by L. Forbes and K. Ahn, entitled "GATE INSULATOR FOR SILICON INTEGRATED CIRCUIT TECHNOLOGY BY THE CARBURIZATION OF SILICON."

Additionally, graded composition insulators to increase the tunneling probability and reduce erase time have been described by the same inventors. (See, L. Forbes and J. M. Eldridge, "GRADED COMPOSITION GATE INSULATORS TO REDUCE TUNNELING BARRIERS IN FLASH MEMORY DEVICES," application Ser. No. 09/945,514.

However, all of these approaches relate to increasing tunneling between the floating gate and the substrate such as is employed in a conventional ETOX device and do not involve tunneling between the control gate and floating gate through and inter-poly dielectric.

Therefore, there is a need in the art to provide improved programmable memory address and decode circuits. The programmable memory address and decode circuits should provide improved flash memory densities while avoiding the large barriers to electron tunneling or hot electron injection presented by the silicon oxide-silicon interface, 3.2 eV, which result in slow write and erase speeds even at very high electric fields. There is also a need to avoid the combination of very high electric fields and damage by hot electron collisions in the which oxide result in a number of operational problems like soft erase error, reliability problems of premature oxide breakdown and a limited number of cycles of write and erase. Further, when using an interpoly dielectric insulator erase approach, the above mentioned problems of having a rough top surface on the polysilicon floating gate which results in, poor quality interpoly oxides, sharp points, localized high electric fields, premature breakdown and reliability problems must be avoided.

SUMMARY OF THE INVENTION

The above mentioned problems with programmable memory address and decode circuits and other problems are addressed by the present invention and will be understood by reading and studying the following specification. Systems and methods are provided for programmable memory address and decode circuits using logic cells, or non-volatile memory cells with metal oxide and/or low tunnel barrier interpoly insulators.

In one embodiment of the present invention, programmable memory address and decode circuits with low tunnel barrier interpoly insulators having a tunnel barrier of approximately 2.0 eV are provided. The decoder for a memory device includes a number of address lines and a number of output lines wherein the address lines and the output lines form an array. A number of logic cells are formed at the intersections of output lines and address lines. Each of the logic cells includes a floating gate transistor which includes a first source/drain region and a second source/drain region separated by a channel region in a substrate. A floating gate opposes the channel region and is separated therefrom by a gate oxide. A control gate opposing the floating gate. The control gate is separated from the floating gate by the low tunnel barrier intergate insulator. The low tunnel barrier intergate insulator includes a metal oxide insulator selected from the group consisting of PbO, $Al_2O_3$, $Ta_2O_5$, $TiO_2$, $ZrO_2$, $Nb_2O_5$ and/or a Perovskite oxide tunnel barrier. The floating gate includes a polysilicon floating gate having a metal layer formed thereon in contact with the low tunnel barrier intergate insulator. And, the control gate includes a polysilicon control gate having a metal layer formed thereon in contact with the low tunnel barrier intergate insulator.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is not to be taken in a limiting sense, and the scope of the present invention is defined only by the appended claims.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 2:
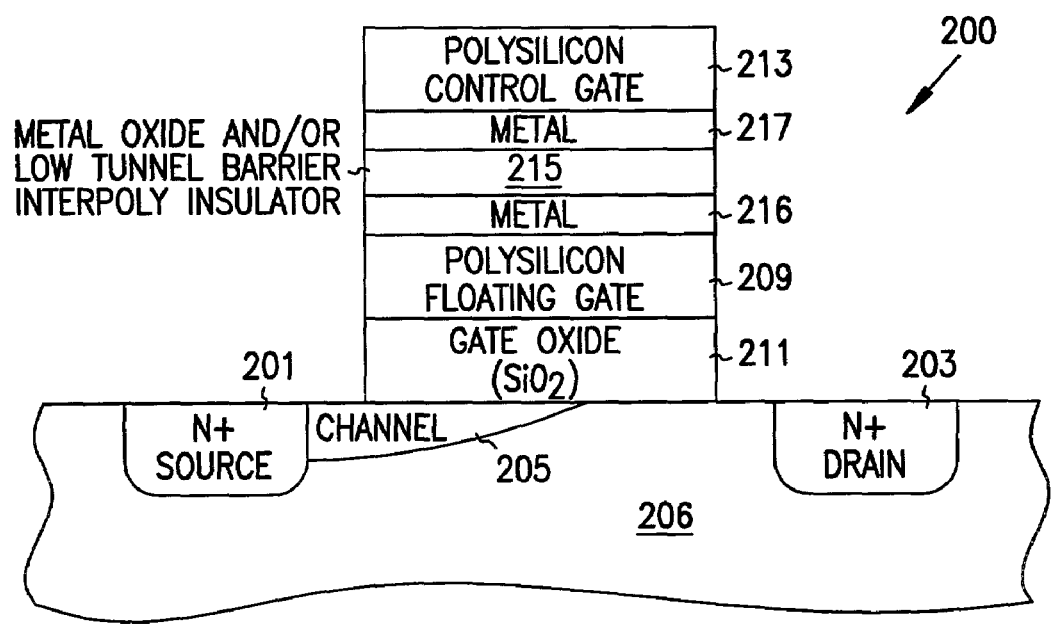
FIG. 2 illustrates one embodiment of a floating gate transistor, or nonvolatile memory cell, according to the teachings of the present invention.

The present invention, describes the use of metal oxide inter-poly dielectric insulators between the control gate and the floating gate. An example is shown in FIG. 2 for a planar structure, or horizontal non-volatile memory cell. According to the teachings of the present invention. The use of metal oxide films for this purpose offer a number of advantages including:

(i) Flexibility in selecting a range of smooth metal film surfaces and compositions that can be oxidized to form tunnel barrier insulators.

(ii) Employing simple "low temperature oxidation" to produce oxide films of highly controlled thickness, composition, purity and uniformity.

(iii) Avoiding inadvertent inter-diffusion of the metal and silicon as well as silicide formation since the oxidation can be carried out at such low temperatures.

(iv) Using metal oxides that provide desirably lower tunnel barriers, relative to barriers currently used such as $SiO_2$.

(v) Providing a wide range of higher dielectric constant oxide films with improved capacitance characteristics.

(vi) Providing a unique ability to precisely tailor tunnel oxide barrier properties for various device designs and applications.

(vii) Permitting the use of thicker tunnel barriers, if needed, to enhance device performance and its control along with yield and reliability.

(viii) Developing layered oxide tunnel barriers by oxidizing layered metal film compositions in order, for example, to enhance device yields and reliability more typical of single insulating layers.

(ix) Eliminating soft erase errors caused by the current technique of tunnel erase from floating gate to the source.

FIG. 2 illustrates one embodiment of a floating gate transistor, or nonvolatile memory cell 200, according to the teachings of the present invention. As shown in FIG. 2, the non-volatile memory cell 200 includes a first source/drain region 201 and a second source/drain region 203 separated by a channel region 205 in a substrate 206. A floating gate 209 opposes the channel region 205 and is separated therefrom by a gate oxide 211. A control gate 213 opposes the floating gate 209. According to the teachings of the present invention, the control gate 213 is separated from the floating gate 209 by a low tunnel barrier intergate insulator 215.

In one embodiment of the present invention, low tunnel barrier intergate insulator 215 includes a metal oxide insulator selected from the group consisting of lead oxide (PbO) and aluminum oxide ($Al_2O_3$). In an alternative embodiment of the present invention, the low tunnel barrier intergate insulator 215 includes a transition metal oxide and the transition metal oxide is selected from the group consisting of $Ta_2O_5$, $TiO_2$, $ZrO_2$ and $Nb_2O_5$. In still another alternative embodiment of the present invention, the low tunnel barrier intergate insulator 215 includes a Perovskite oxide tunnel barrier.

According to the teachings of the present invention, the floating gate 209 includes a polysilicon floating gate 209 having a metal layer 216 formed thereon in contact with the low tunnel barrier intergate insulator 215. Likewise, the control gate 213 includes a polysilicon control gate 213 having a metal layer 217 formed thereon in contact with the low tunnel barrier intergate insulator 215. In this invention, the metal layers, 216 and 217, are formed of the same metal material used to form the metal oxide interpoly insulator 215.

Figure 3:
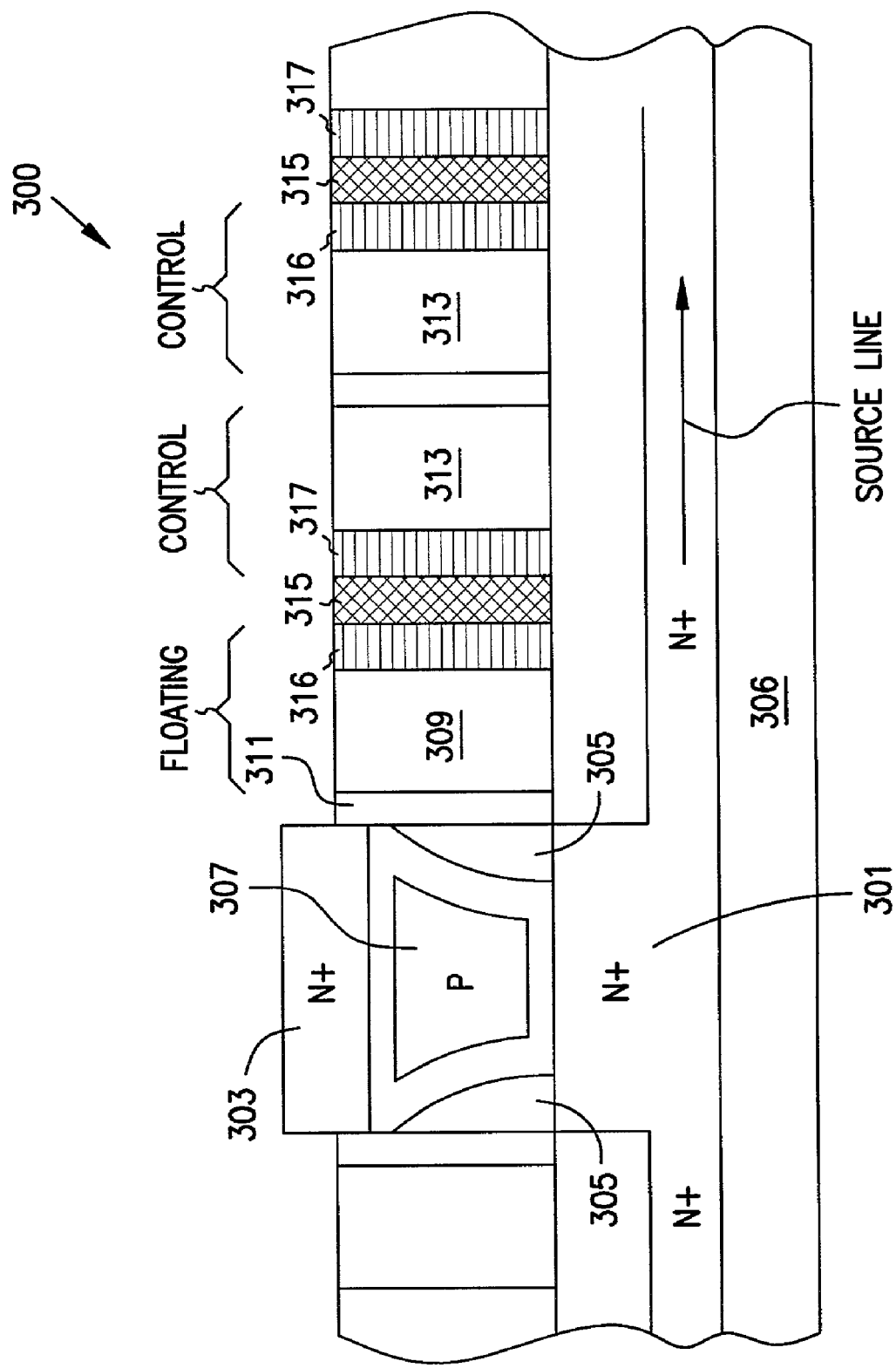
FIG. 3 illustrates another embodiment of a floating gate transistor, or nonvolatile memory cell, according to the teachings of the present invention.

FIG. 3 illustrates another embodiment of a floating gate transistor, or nonvolatile memory cell 300, according to the teachings of the present invention. As shown in the embodiment of FIG. 3, the non-volatile memory cell 300 includes a vertical non volatile memory cell 300. In this embodiment, the non-volatile memory cell 300 has a first source/drain region 301 formed on a substrate 306. A body region 307 including a channel region 305 is formed on the first source/drain region 301. A second source/drain region 303 is formed on the body region 307. Methods for forming such a vertical transistor structure are disclosed in U.S. Pat. No. 6,135,175, entitled "Memory Address Decode Array with vertical transistors, which is incorporated herein by reference. A floating gate 309 opposes the channel region 305 and is separated therefrom by a gate oxide 311. A control gate 313 opposes the floating gate 309. According to the teachings of the present invention, the control gate 313 is separated from the floating gate 309 by a low tunnel barrier intergate insulator 315.

According to the teachings of the present invention, the low tunnel barrier intergate insulator 315 includes a metal oxide insulator 315 selected from the group consisting of PbO, $Al_2O_3$, $Ta_2O_5$, $TiO_2$, $ZrO_2$, and $Nb_2O_5$. In still another alternative embodiment of the present invention, the low tunnel barrier intergate insulator 315 includes a Perovskite oxide tunnel barrier. The floating gate 309 includes a polysilicon floating gate 309 having a metal layer 316 formed thereon in contact with the low tunnel barrier intergate insulator 315. The control gate 313 includes a polysilicon control gate 313 having a metal layer 317 formed thereon in contact with the low tunnel barrier intergate insulator 315.

As shown in FIG. 3, the floating gate 309 includes a vertical floating gate 309 formed alongside of the body region 307. In the embodiment shown in FIG. 3, the control gate 313 includes a vertical control gate 313 formed alongside of the vertical floating gate 309.

As will be explained in more detail below, the floating gate 309 and control gate 313 orientation shown in FIG. 3 is just one embodiment for a vertical non volatile memory cell 300, according to the teachings of the present invention. In other embodiments, explained below, the floating gate includes a horizontally oriented floating gate formed alongside of the body region. In this alternative embodiment, the control gate includes a horizontally oriented control gate formed above the horizontally oriented floating gate.

Figure 4:
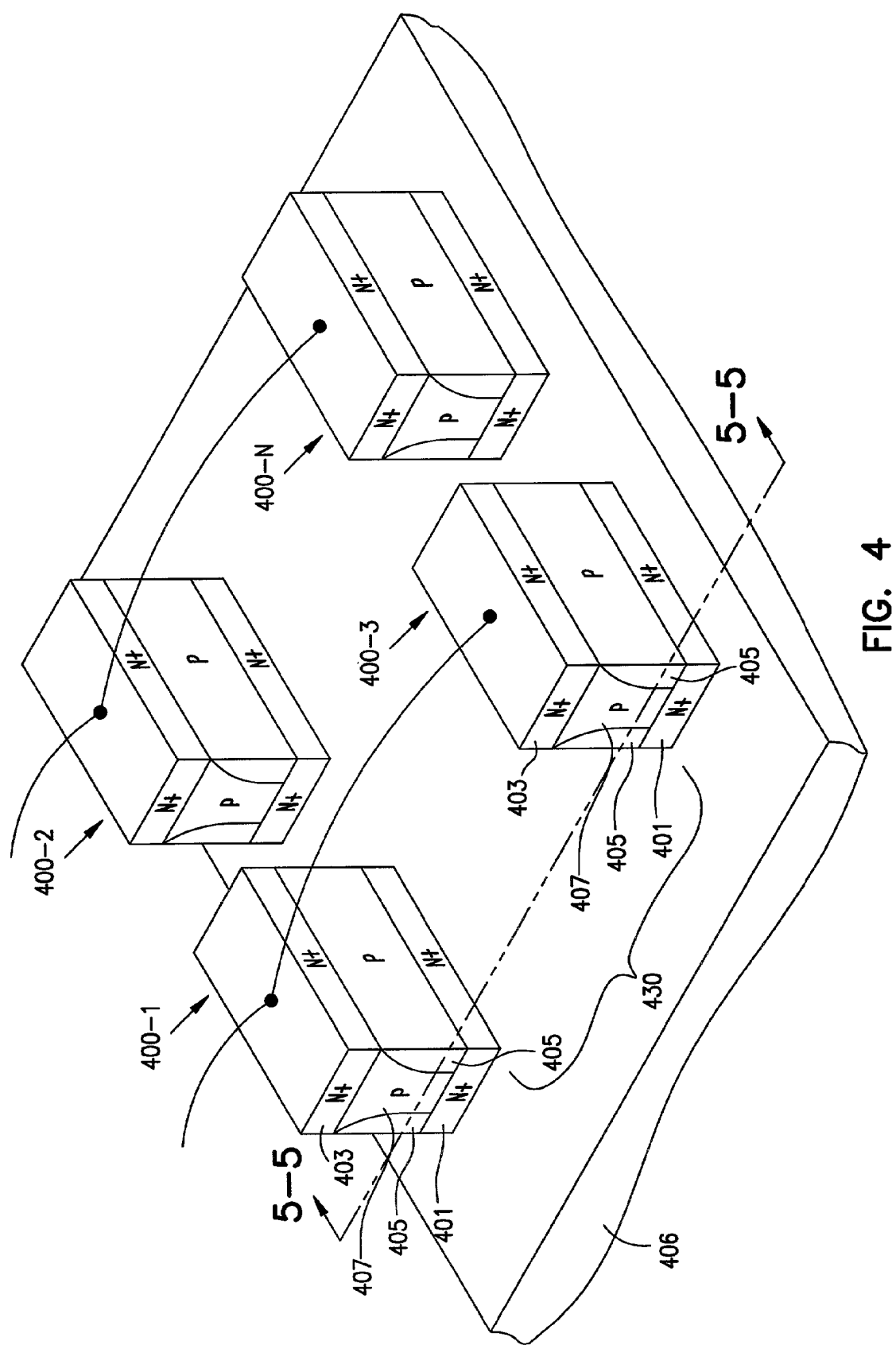
FIG. 4 is a perspective view illustrating an array of silicon pillars formed on a substrate as used in one embodiment according to the teachings of the present invention.

FIG. 4 is a perspective view illustrating an array of silicon pillars 400-1, 400-2, 400-3, . . . , 400-N, formed on a substrate 406 as used in one embodiment according to the teachings of the present invention. As will be understood by one of ordinary skill in the art upon reading this disclosure, the substrates can be (i) conventional p-type bulk silicon or p-type epitaxial layers on p+ wafers, (ii) silicon on insulator formed by conventional SIMOX, wafer bonding and etch back or silicon on sapphire, or (iii) small islands of silicon on insulator utilizing techniques such as described in more detail in U.S. Pat. No. 5,691,230, by Leonard Forbes, entitled "Technique for Producing Small Islands of Silicon on Insulator," issued Nov. 25, 1997, which is incorporated herein by reference.

As shown in FIG. 4, each pillar in the array of silicon pillars 400-1, 400-2, 400-3, . . . , 400-N, includes a first source/drain region 401 and a second source/drain region 403. The first and the second source/drain regions, 401 and 403, are separated by a body region 407 including channel regions 405. As shown in FIG. 4, a number of trenches 430 separate adjacent pillars in the array of silicon pillars 400-1, 400-2, 400-3, . . . , 400-N. Trenches 430 are referenced in connection with the discussion which follows in connection with FIGS. 5A–5E.

Figure 5A:
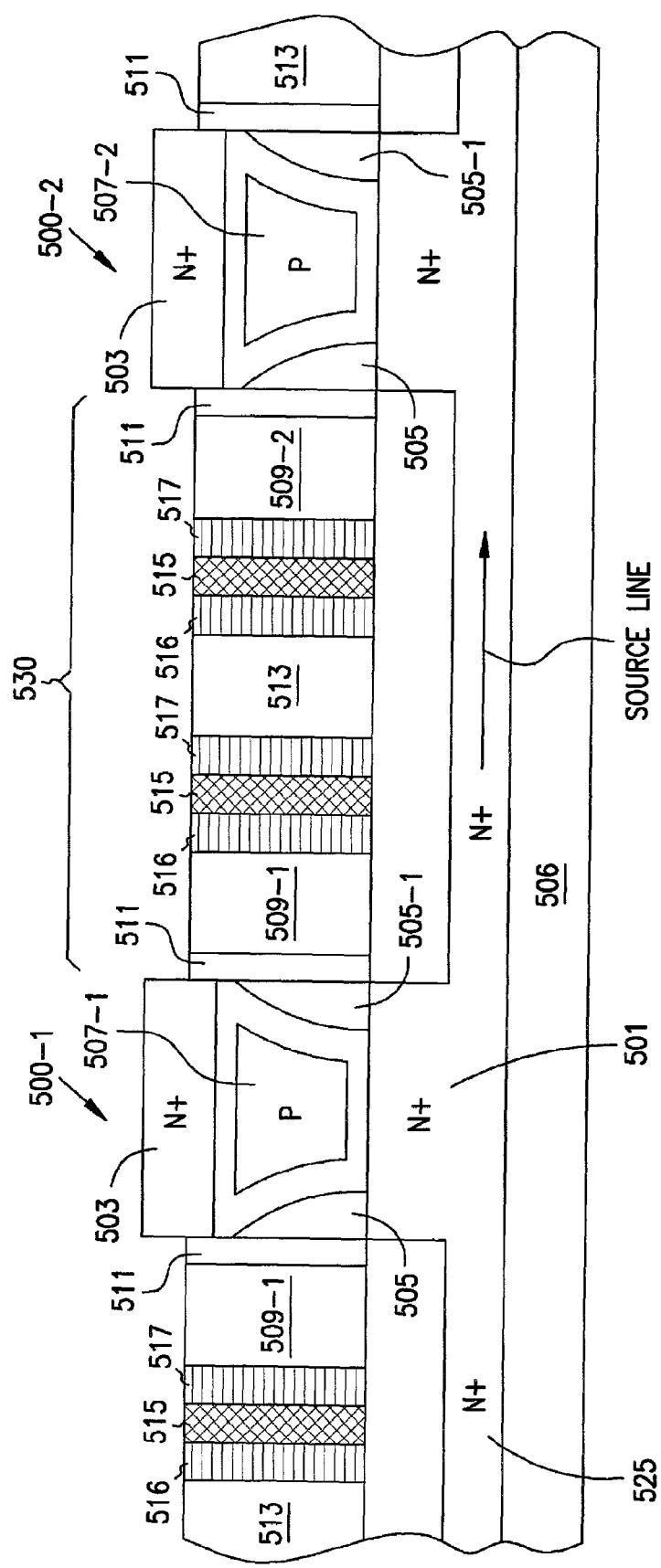
FIGS. 5A–5E are cross sectional views taken along cut line 5—5 from FIG. 4 illustrating a number of floating gate and control gate configurations which are included in the scope of the present invention.

FIGS. 5A–5E are cross sectional views taken along cut line 5—5 from FIG. 4. As mentioned above in connection with FIG. 3, a number of floating gate and control gate configurations are included in the present invention. FIG. 5A illustrates one such embodiment of the present invention. FIG. 5A illustrates a first source/drain region 501 and second source/drain region 503 for a non-volatile memory cell 500 formed according to the teachings of the present invention. As shown in FIG. 5, the first and second source/drain regions, 501 and 503, are contained in a pillar of semiconductor material, and separated by a body region 507 including channel regions 505. As shown in the embodiments of FIGS. 5A–5E, the first source/drain region 501 is integrally connected to a buried sourceline 525. As one or ordinary skill in the art will understand upon reading this disclosure the buried sourceline 525 is be formed of semiconductor material which has the same doping type as the first source/drain region 501. In one embodiment, the sourceline 525 is formed of semiconductor material of the same doping as the first source/drain region 501, but is more heavily doped than the first source/drain region 501.

As shown in the embodiment of FIG. 5A, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In this embodiment, a single control gate 513 is shared by the pair of floating gates 509-1 and 509-2 on opposing sides of the trench 530. As one of ordinary skill in the art will understand upon reading this disclosure, the shared single control gate 513 can include an integrally formed control gate line. As shown in FIG. 5A, such an integrally formed control gate line 513 can be one of a plurality of control gate lines which are each independently formed in the trench, such as trench 530, below the top surface of the pillars 500-1 and 500-2 and between the pair of floating gates 509-1 and 509-2. In one embodiment, according to the teachings of the present invention, each floating gate, e.g. 509-1 and 509-2, includes a vertically oriented floating gate having a vertical length of less than 100 nanometers.

Figure 5B:
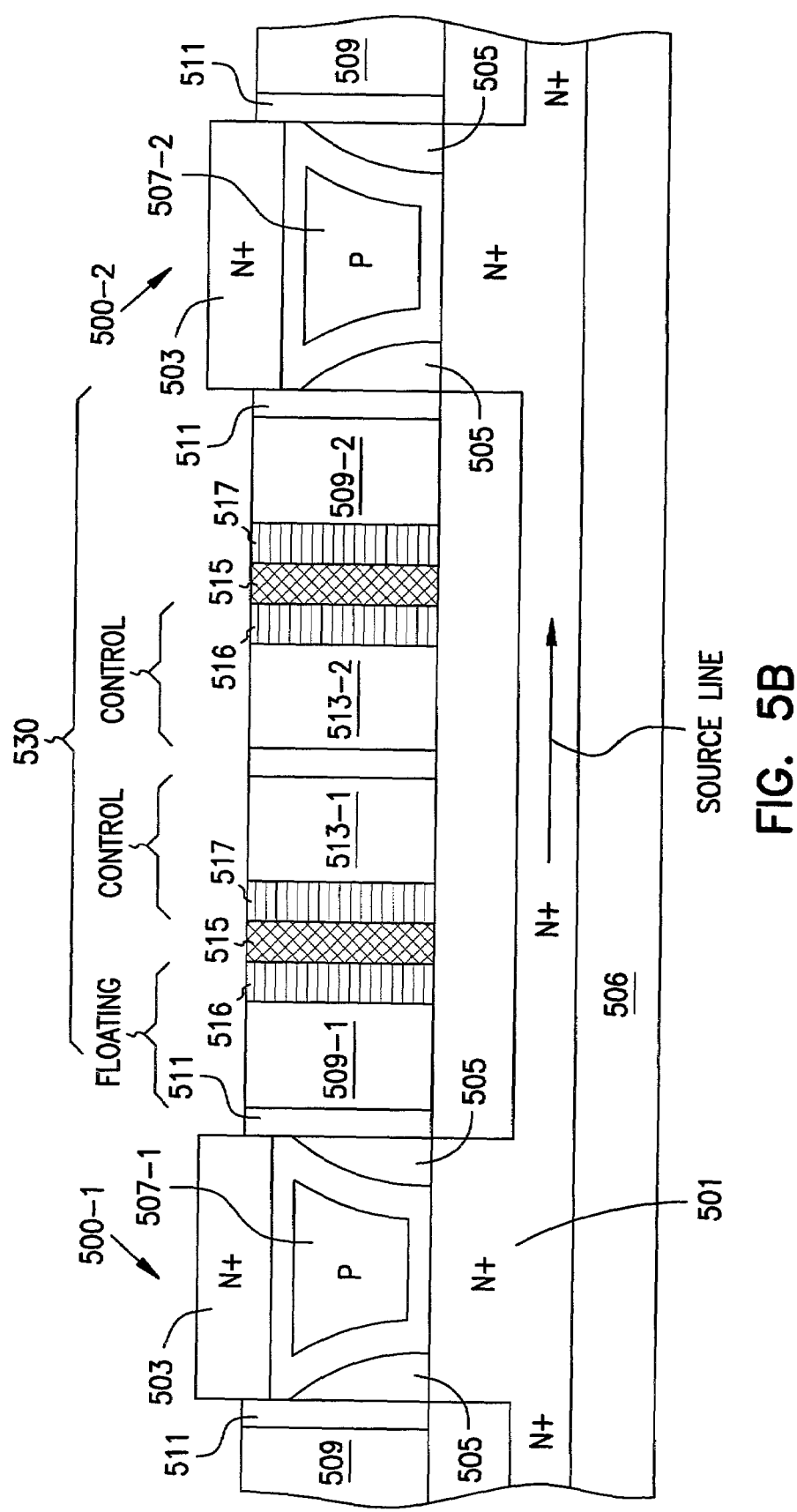

As shown in the embodiment of FIG. 5B, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5B, a plurality of control gate lines are again formed in trenches, e.g. trench 530, below the top surface of the pillars, 500-1 and 500-2, and between the pair of floating gates 509-1 and 509-2. However, in this embodiment, each trench, e.g. 530, houses a pair of control gate lines, shown as 513-1 and 513-2. Each one of the pair of control gate lines 513-1 and 513-2 adresses the floating gates, 509-1 and 509-2 respectively, on opposing sides of the trench 530. In this embodiment, the pair of control gate lines, or control gates 513-1 and 513-2 are separated by an insulator layer.

Figure 5C:
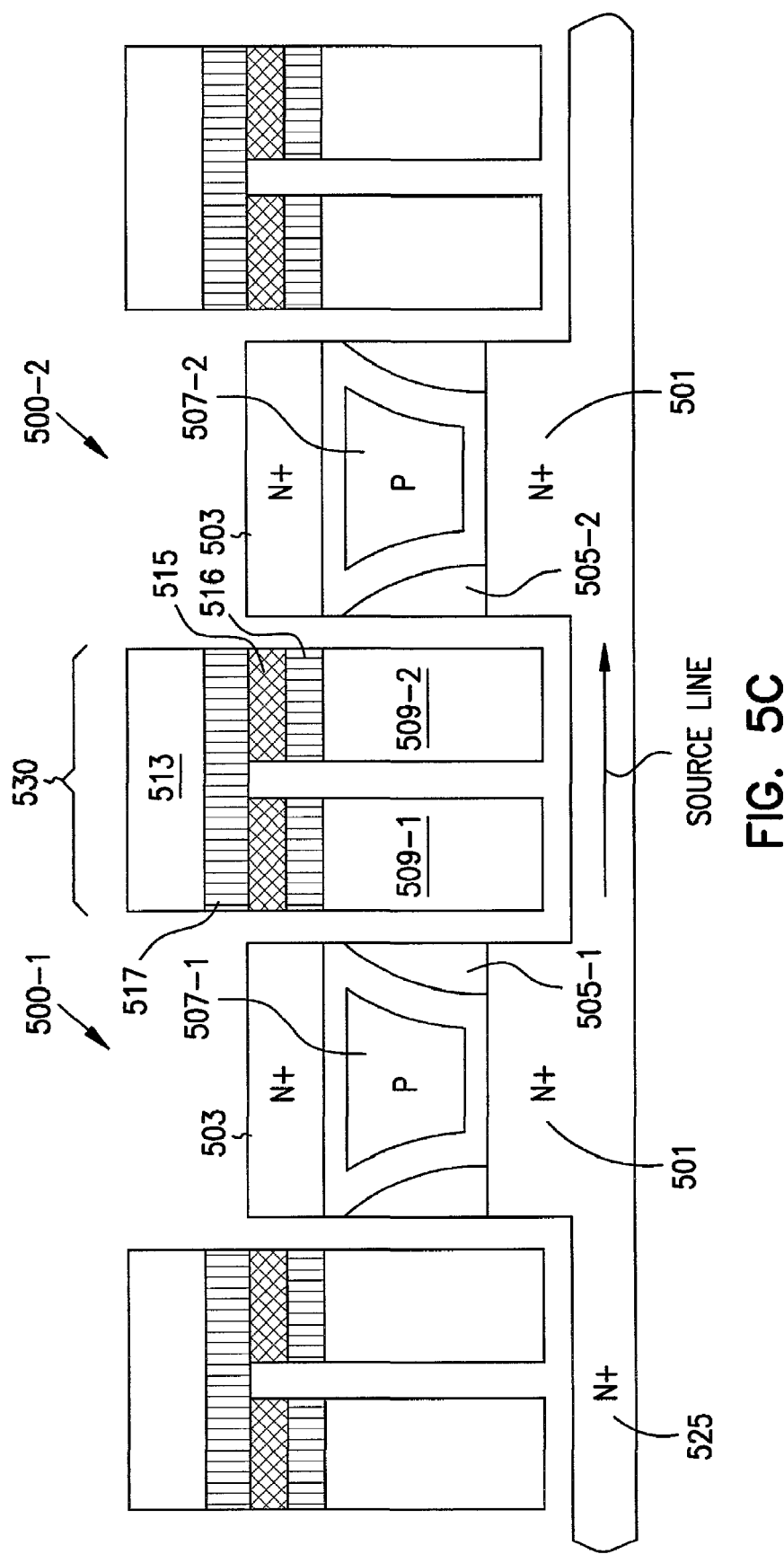

As shown in the embodiment of FIG. 5C, a pair of floating gates 509-1 and 509-2 are again formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5C, the plurality of control gate lines are disposed vertically above the floating gates. That is, in one embodiment, the control gate lines are located above the pair of floating gates 509-1 and 509-2 and not fully beneath the top surface of the pillars 500-1 and 500-2. In the embodiment of FIG. 5C, each pair of floating gates, e.g. 509-1 and 509-2, in a given trench shares a single control gate line, or control gate 513.

Figure 5D:
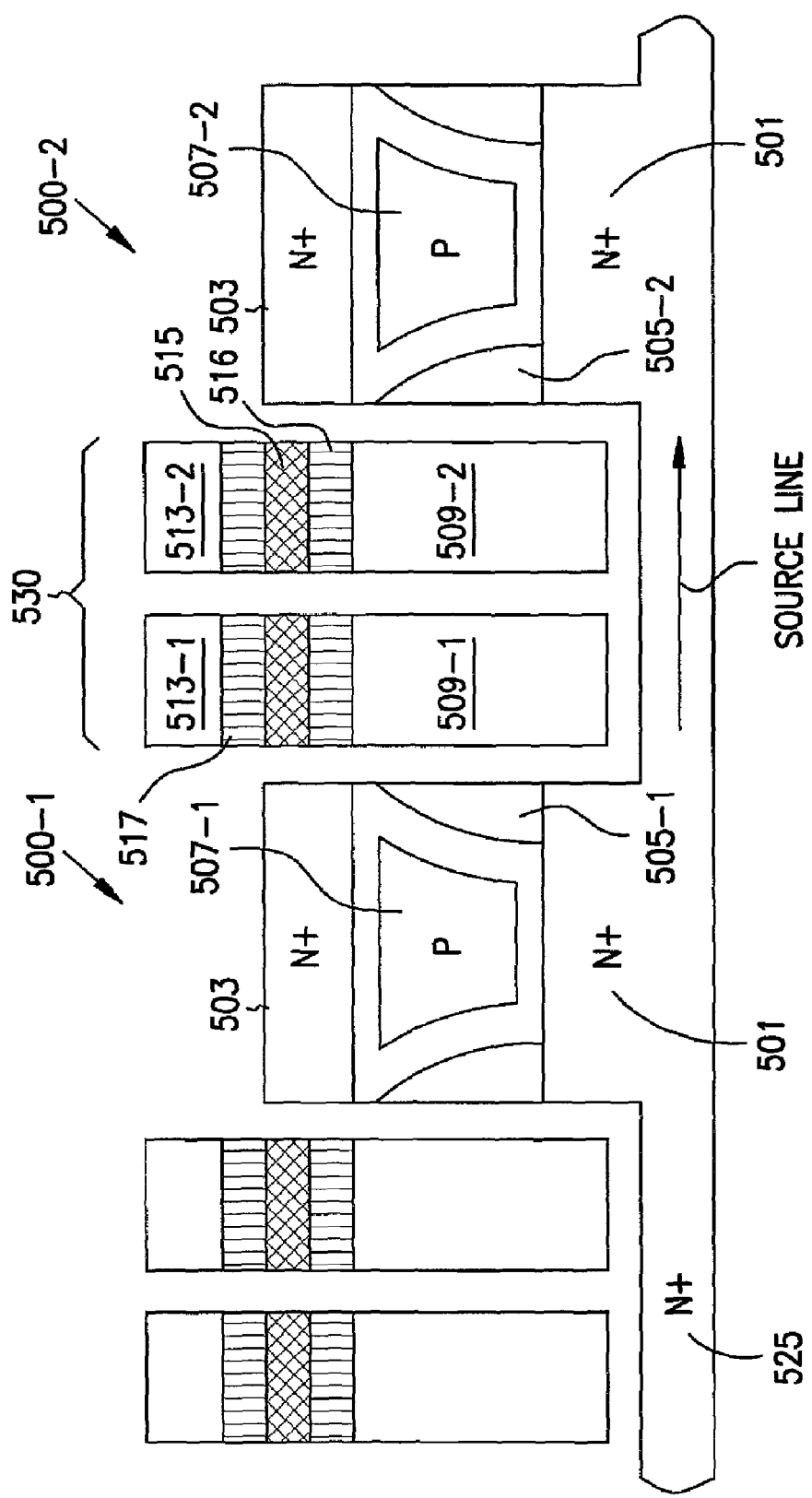

As shown in the embodiment of FIG. 5D, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5D, the plurality of control gate lines are disposed vertically above the floating gates. That is, in one embodiment, the control gate lines are located above the pair of floating gates 509-1 and 509-2 and not fully beneath the top surface of the pillars 500-1 and 500-2. However, in the embodiment of FIG. 5D, each one of the pair of floating gates, e.g. 509-1 and 509-2, is addressed by an independent one of the plurality of control lines or control gates, shown in FIG. 5D as 513-1 and 513-2.

Figure 5E:
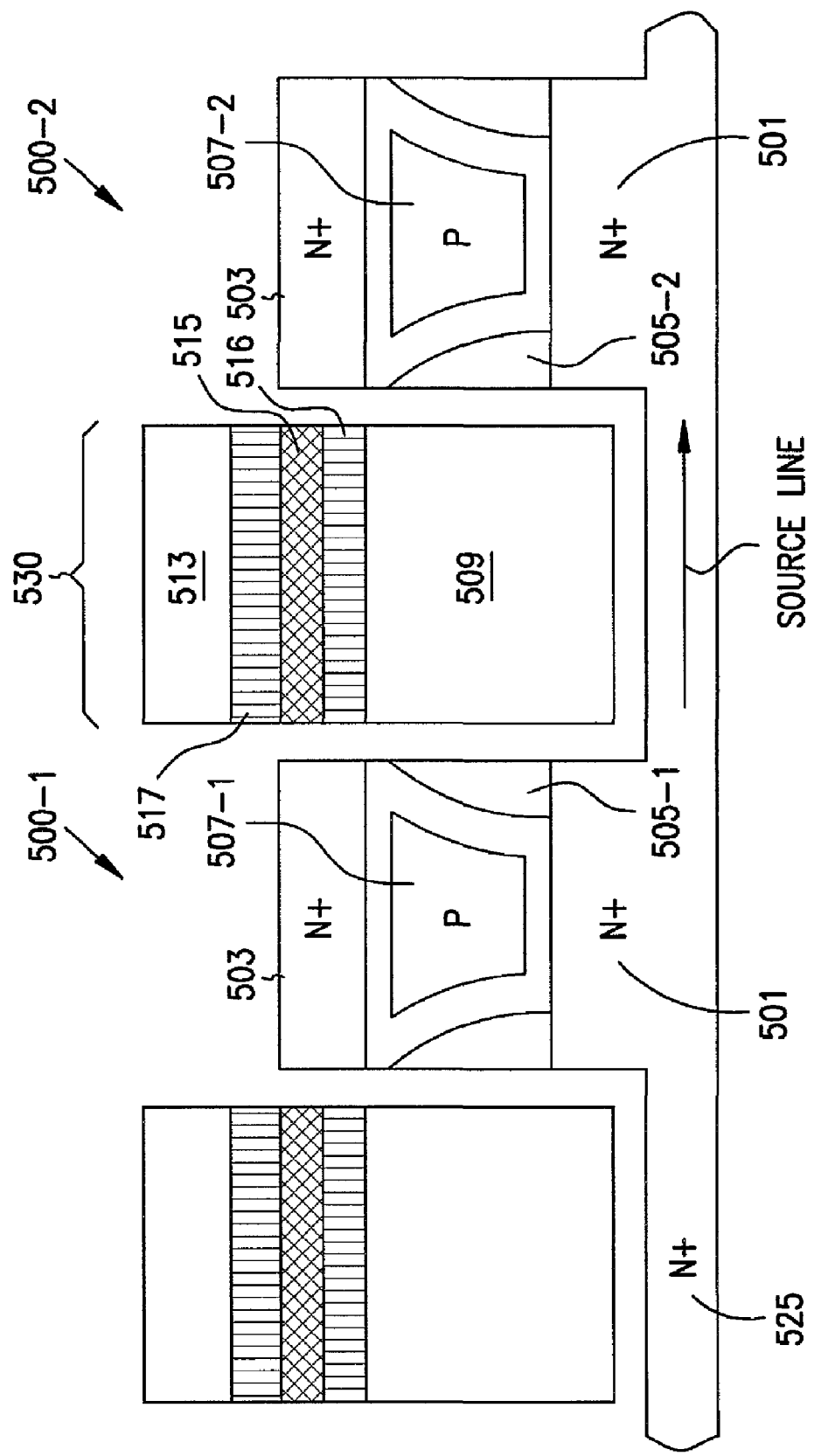

As shown in the embodiment of FIG. 5E, a single floating gate 509 is formed in each trench 530 between adjacent pillars which form memory cells 500-1 and 500-2. According to the teachings of the present invention, the single floating gate 509 can be either a vertically oriented floating gate 509 or a horizontally oriented floating gate 509 formed by conventional processing techniques, or can be a horizontally oriented floating gate 509 formed by a replacement gate technique such as described in a copending application, entitled "Flash Memory with Ultrathin Vertical Body Transistors," by Leonard Forbes and Kie Y. Ahn, application Ser. No. 09/780,169. In one embodiment of the present invention, the floating gate 509 has a vertical length facing the body region 505 of less than 100 nm. In another embodiment, the floating gate 509 has a vertical length facing the body region 505 of less than 50 nm. In one embodiment, as shown in FIG. 5E, the floating gate 509 is shared, respectively, with the body regions 507-1 and 507-2, including channel regions 505-1 and 505-2, in adjacent pillars 500-1 and 500-2 located on opposing sides of the trench 530. And, as shown in FIG. 5E, the control gate includes a single horizontally oriented control gate line, or control gate 513 formed above the horizontally oriented floating gate 509.

As one of ordinary skill in the art will understand upon reading this disclosure, in each of the embodiments described above in connection with FIGS. 5A–5E the floating gates 509 are separated from the control gate lines, or control gates 513 with a low tunnel barrier intergate insulator in accordance with the descriptions given above in connection with FIG. 3. The modifications here are to use tunneling through the interpoly dielectric to realize flash memory devices. The vertical devices include an extra flexibility in that the capacitors, e.g. gate oxide and intergate insulator, are easily fabricated with different areas. This readily allows the use of very high dielectric constant inter-poly dielectric insulators with lower tunneling barriers.

Figure 6A:
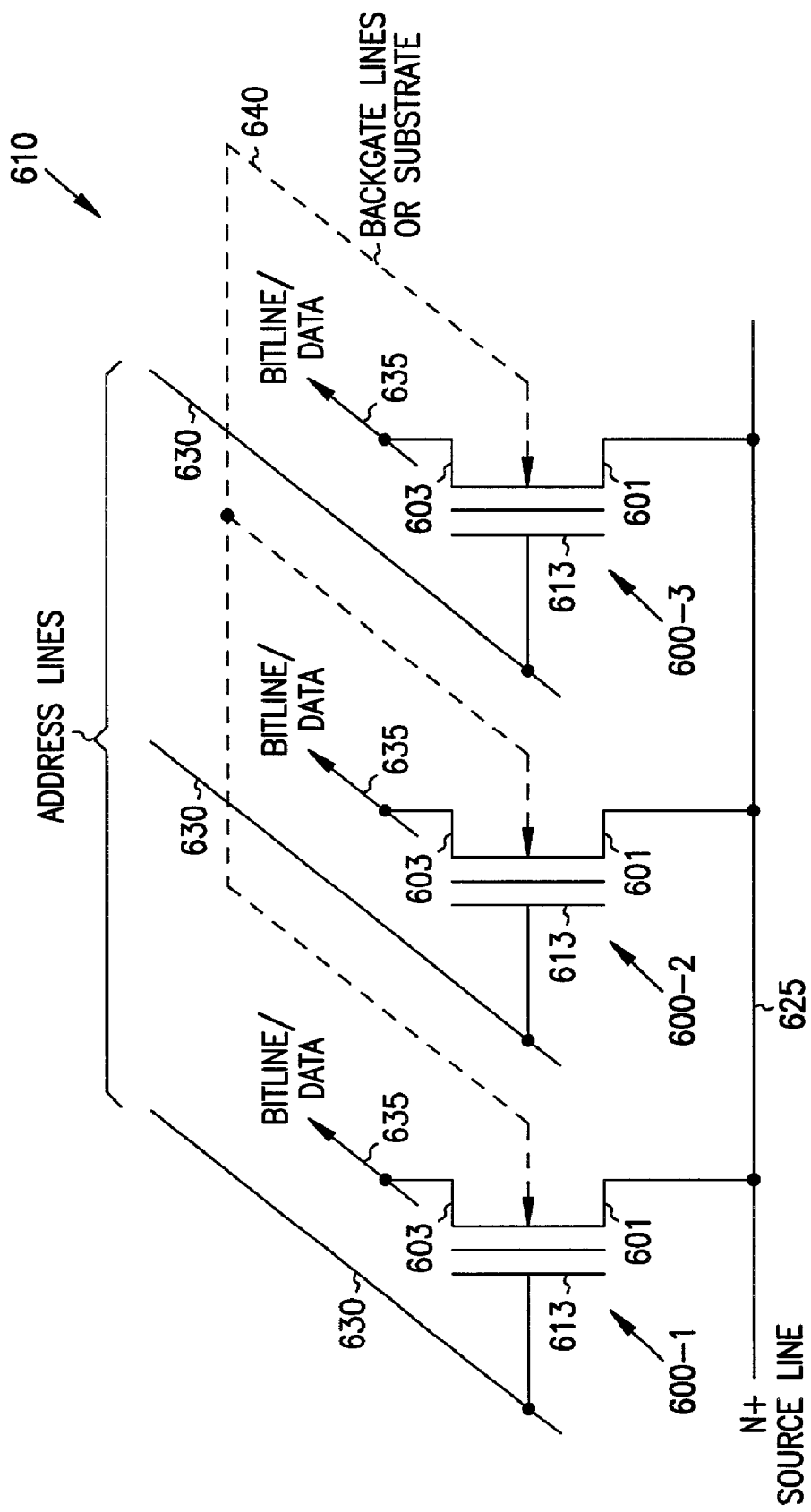
FIGS. 6A–6D illustrate a number of address coincidence schemes that can be used together with the present invention.
Figure 6B:
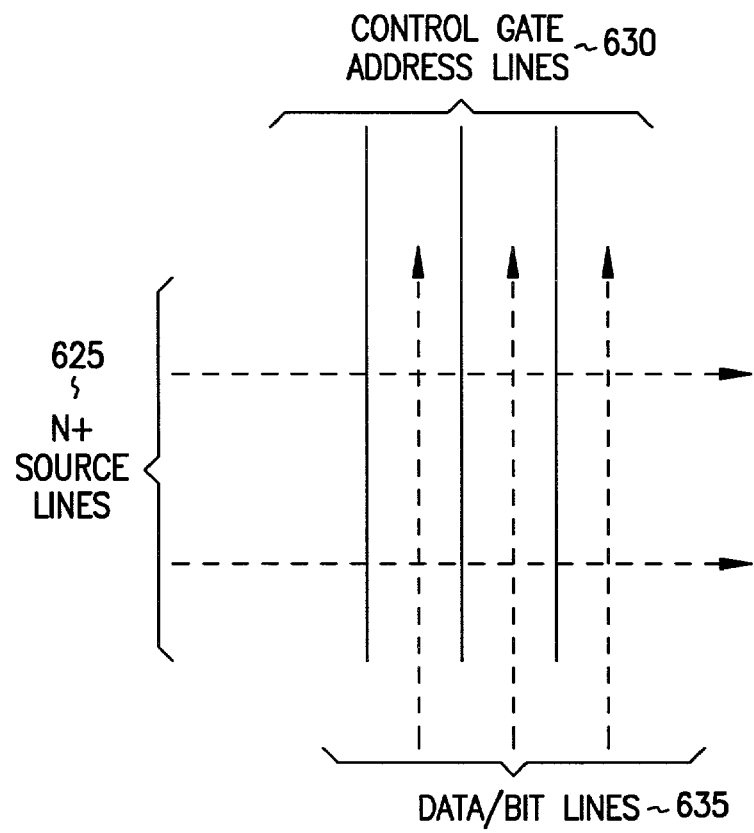
Figure 6C:
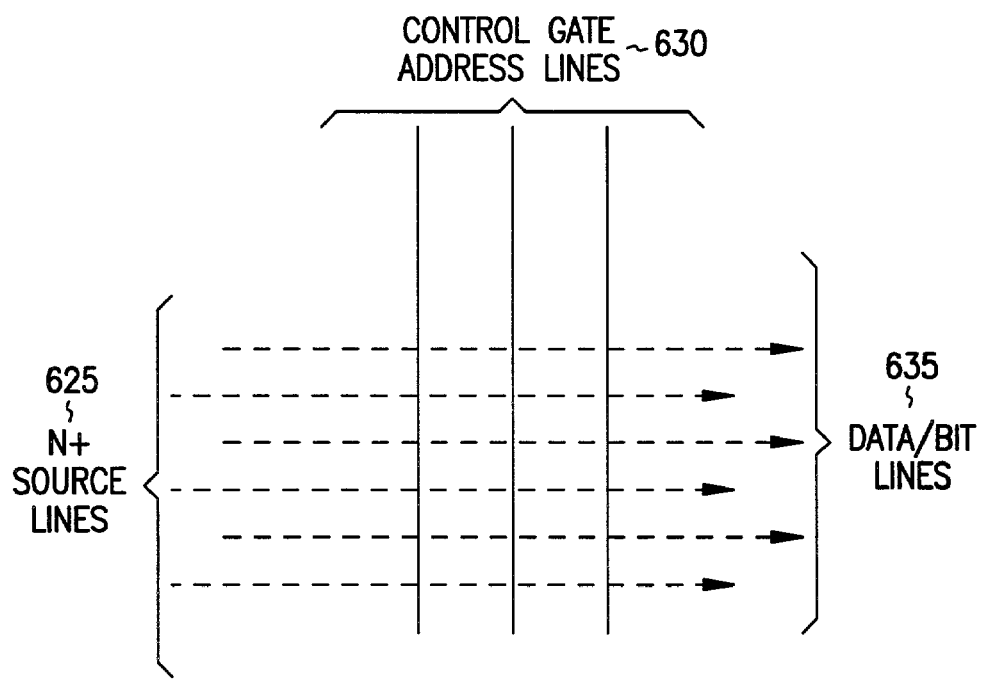
Figure 6D:
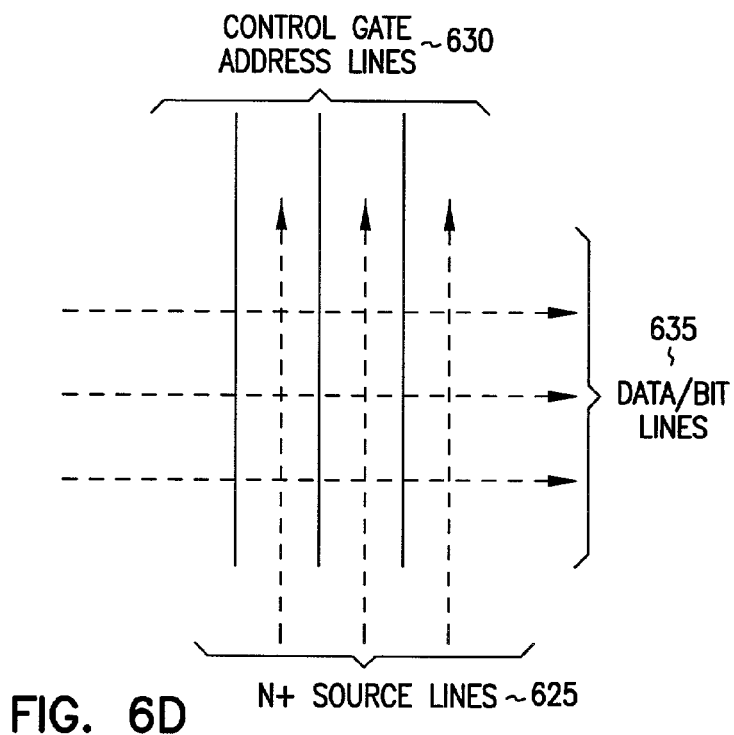

FIGS. 6A–6C illustrate that a number of address coincidence schemes can be used together with the present invention. FIG. 6A illustrates a NOR flash memory array 610 having a number of non-volatile memory cells 600-1, 600-2, 6003, using a coincidence address array scheme. For purposes of illustration, FIG. 6A shows a sourceline 625 coupled to a first source/drain region 601 in each of the number of non-volatile memory cells 600-1, 600-2, 600-3. The sourceline is shown oriented in a first selected direction in the flash memory array 610. In FIG. 6A, a number of control gate lines 630 are shown oriented in a second selected direction in the flash memory array 610. As shown in FIG. 6A, the number of control gate lines 630 are coupled to, or integrally formed with the control gates 613 for the number of non-volatile memory cells 600-1, 600-2, 600-3. As shown in FIG. 6A, the second selected direction is orthogonal to the first selected direction. Finally, FIG. 6A shows a number of bitlines 635 oriented in a third selected direction in the flash memory array 610. As shown in FIG. 6A, the number of bitlines are coupled to the second source/drain regions 603 in the number of non-volatile memory cells 600-1, 600-2, 600-3. In the embodiment shown in FIG. 6A the third selected direction is parallel to the second selected direction and the number of control gate lines 630 serve as address lines. Also, as shown in FIG. 6A, the flash memory array 610 includes a number of backgate or substrate/well bias address lines 640 coupled to the substrate.

Using FIG. 6A as a reference point, FIGS. 6B–6C illustrate of top view for three different coincidence address scheme layouts suitable for use with the present invention. First, FIG. 6B provides the top view layout of the coincidence address scheme described in connection with FIG. 6A. This is, FIG. 6B illustrates a number of sourcelines 625 oriented in a first selected direction, a number of control gate lines 630 oriented in a second selected direction, and a number of bitlines 635 oriented in a third selected direction for the flash memory array 600. In the embodiment of FIG. 6B, the first selected direction and the third selected direction are parallel to one another and orthogonal to the second selected direction. In this embodiment, the number of control gate lines 630 serve as address lines. According to the teachings of the present invention, the output lines, e.g. bitlines 635 are perpendicular to the address lines, e.g. in this embodiment control gate lines 630.

FIG. 6C provides the top view layout of yet another coincidence address scheme according to the teachings of the present invention. This is, FIG. 6C illustrates a number of sourcelines 625 oriented in a first selected direction, a number of control gate lines 630 oriented in a second selected direction, and a number of bitlines 635 oriented in a third selected direction for the flash memory array 600. In the embodiment of FIG. 6C, the first selected direction and the second selected direction are parallel to one another and orthogonal to the third selected direction. In this embodiment, the number of bitlines 635 serve as output data lines. In an alternative embodiment, the sourcelines 625 can include a uniform ground plane as the same will be known and understood by one of ordinary skill in the art.

As will be apparent to one of ordinary skill in the art upon reading this disclosure, and as will be described in more detail below, write can still be achieved by hot electron injection and/or, according to the teachings of the present invention, tunneling from the control gate. According to the teachings of the present invention, block erase is accomplished by driving the control gates with a relatively large positive voltage and tunneling from the metal on top of the floating gate to the metal on the bottom of the control gate.

Figure 7A:
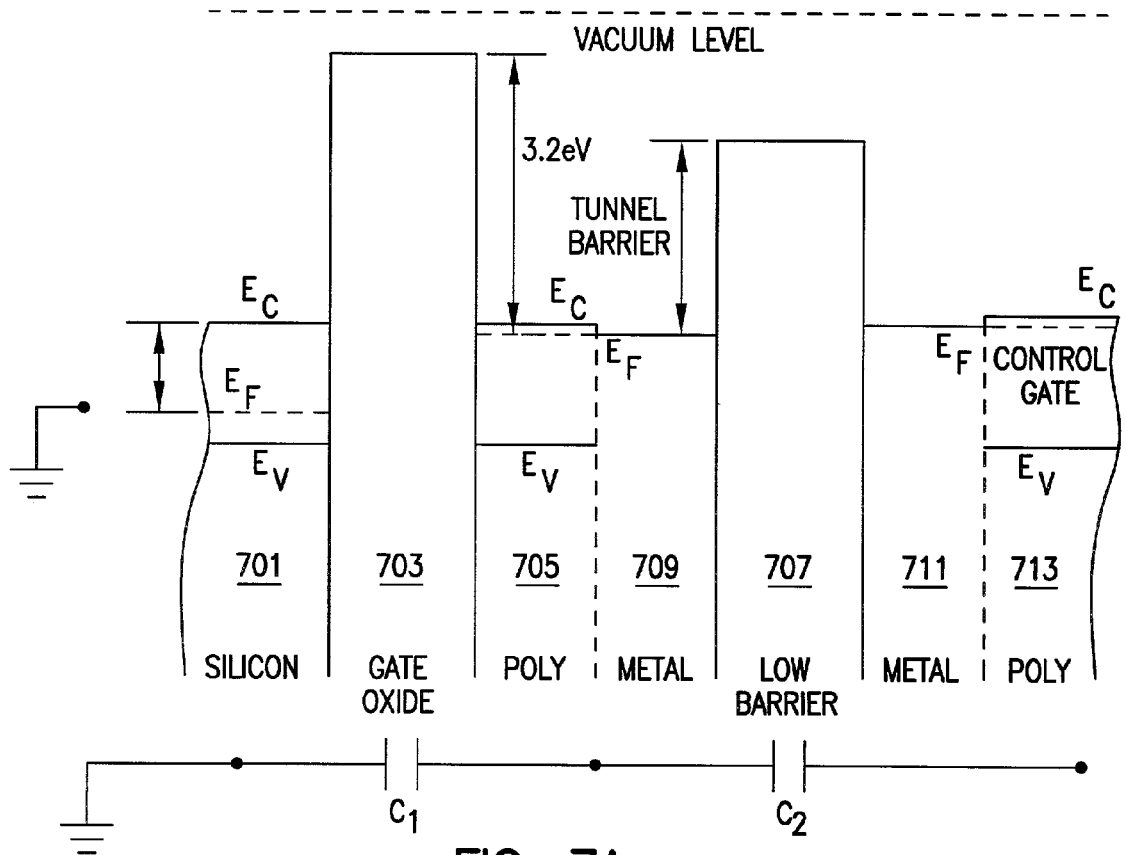
FIG. 7A is an energy band diagram illustrating the band structure at vacuum level with the low tunnel barrier interpoly insulator according to the teachings of the present invention.

FIG. 7A is an energy band diagram illustrating the band structure at vacuum level with the low tunnel barrier interpoly insulator according to the teachings of the present invention. FIG. 7A is useful in illustrating the reduced tunnel barrier off of the floating gate to the control gate and for illustrating the respective capacitances of the structure according to the teachings of the present invention.

FIG. 7A shows the band structure of the silicon substrate, e.g. channel region 701, silicon dioxide gate insulator, e.g. gate oxide 703, polysilicon floating gate 705, the low tunnel barrier interpoly dielectric 707, between metal plates 709 and 711, and then the polysilicon control gate 713, according to the teachings of the present invention.

The design considerations involved are determined by the dielectric constant, thickness and tunneling barrier height of the interpoly dielectric insulator 707 relative to that of the silicon dioxide gate insulator, e.g. gate oxide 703. The tunneling probability through the interpoly dielectric 707 is an exponential function of both the barrier height and the electric field across this dielectric.

Figure 7B:
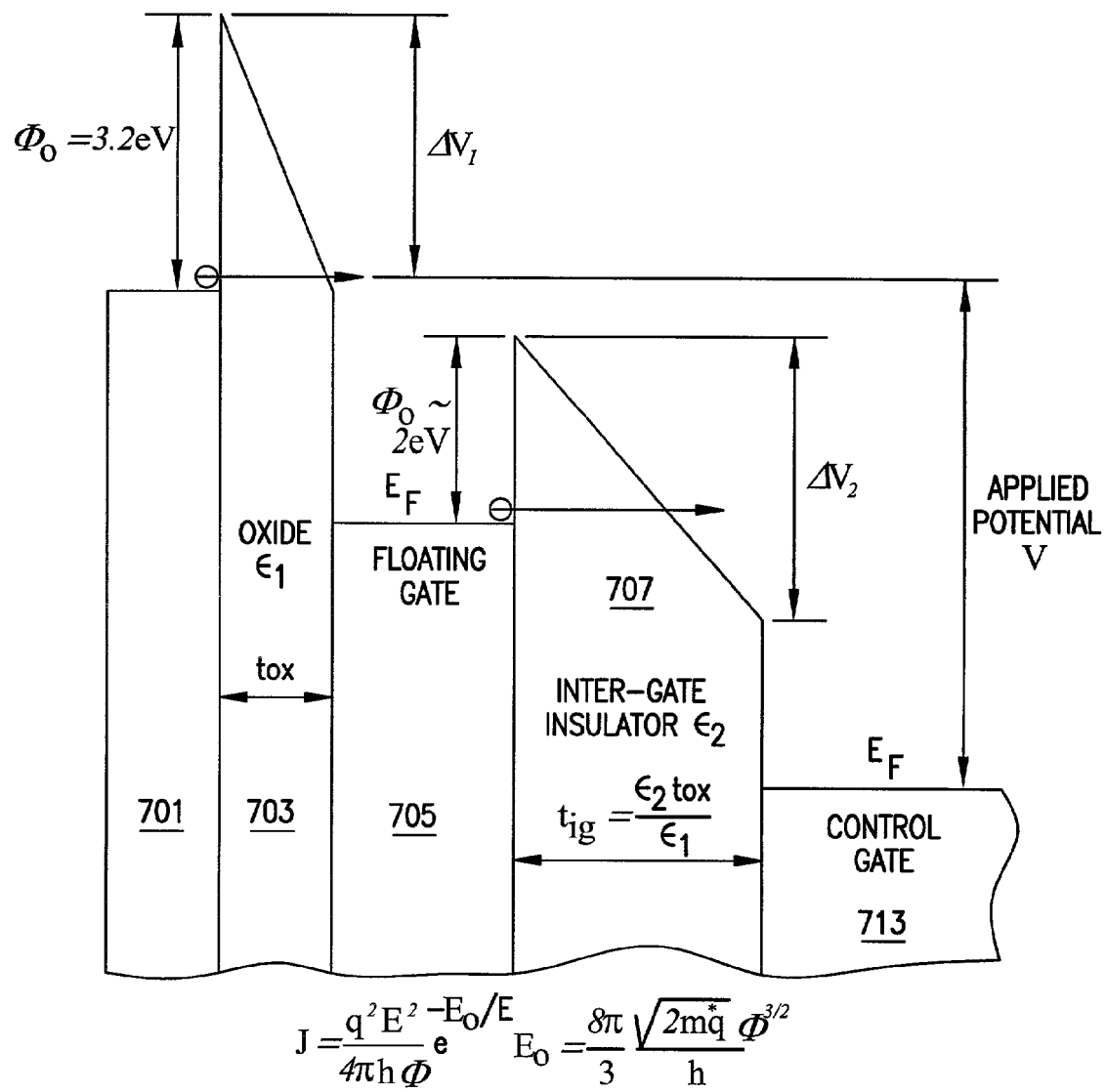
FIG. 7B is an energy band diagram illustrating the band structure during an erase operation of electrons from the floating gate to the control gate across the low tunnel barrier interpoly insulator according to the teachings of the present invention.

FIG. 7B is an energy band diagram illustrating the band structure during an erase operation of electrons from the floating gate 705 to the control gate 713 across the low tunnel barrier interpoly insulator 707 according to the teachings of the present invention. FIG. 7B is similarly useful in illustrating the reduced tunnel barrier off of the floating gate to the control gate and for illustrating the respective capacitances of the structure according to the teachings of the present invention.

As shown in FIG. 7B, the electric field is determined by the total voltage difference across the structure, the ratio of the capacitances (see FIG. 7A), and the thickness of the interpoly dielectric 707. The voltage across the interpoly dielectric 707 will be, $\Delta V2 = V\, C1/(C1+C2)$, where V is the total applied voltage. The capacitances, C, of the structures depends on the dielectric constant, $\epsilon_r$, the permittivity of free space, $\epsilon_o$, and the thickness of the insulating layers, t, and area, A, such that $C = \epsilon_r \epsilon_o A/t$, Farads/cm$^2$, where $\epsilon_r$ represents the low frequency dielectric constant. The electric field across the interpoly dielectric insulator 707, having capacitance, C2, will then be $E2 = \Delta V2/t2$, where t2 is the thickness of this layer.

The tunneling current in erasing charge from the floating gate 705 by tunneling to the control gate 713 will then be as shown in FIG. 7B given by an equation of the form:

$$J = B\,\exp(-Eo/E)$$

where E is the electric field across the interpoly dielectric insulator 707 and Eo depends on the barrier height. Practical values of current densities for aluminum oxide which has a current density of 1 A/cm$^2$ at a field of about $E=1V/20$ A$=5\times 10^{+6}$ V/cm are evidenced in a description by Pollack. (See generally, S. R. Pollack and C. E. Morris, "Tunneling through gaseous oxidized films of Al$_2$O$_3$," Trans. AIME, Vol. 233, p. 497, 1965). Practical current densities for silicon oxide transistor gate insulators which has a current density of 1 A/cm$^2$ at a field of about $E=2.3V/23$ A$=1\times 10^{+7}$ V/cm are evidenced in a description by T. P. Ma et al. (See generally, T. P. Ma et al., "Tunneling leakage current in ultrathin (<a4 nm) nitride/oxide stack dielectrics," IEEE Electron Device Letters, vol. 19, no. 10, pp. 388–390, 1998).

The lower electric field in the aluminum oxide interpoly insulator 707 for the same current density reflects the lower tunneling barrier of less than 2 eV, shown in FIG. 7B, as opposed to the 3.2 eV tunneling barrier of silicon oxide 703, also illustrated in FIG. 7B.

Figure 7C:
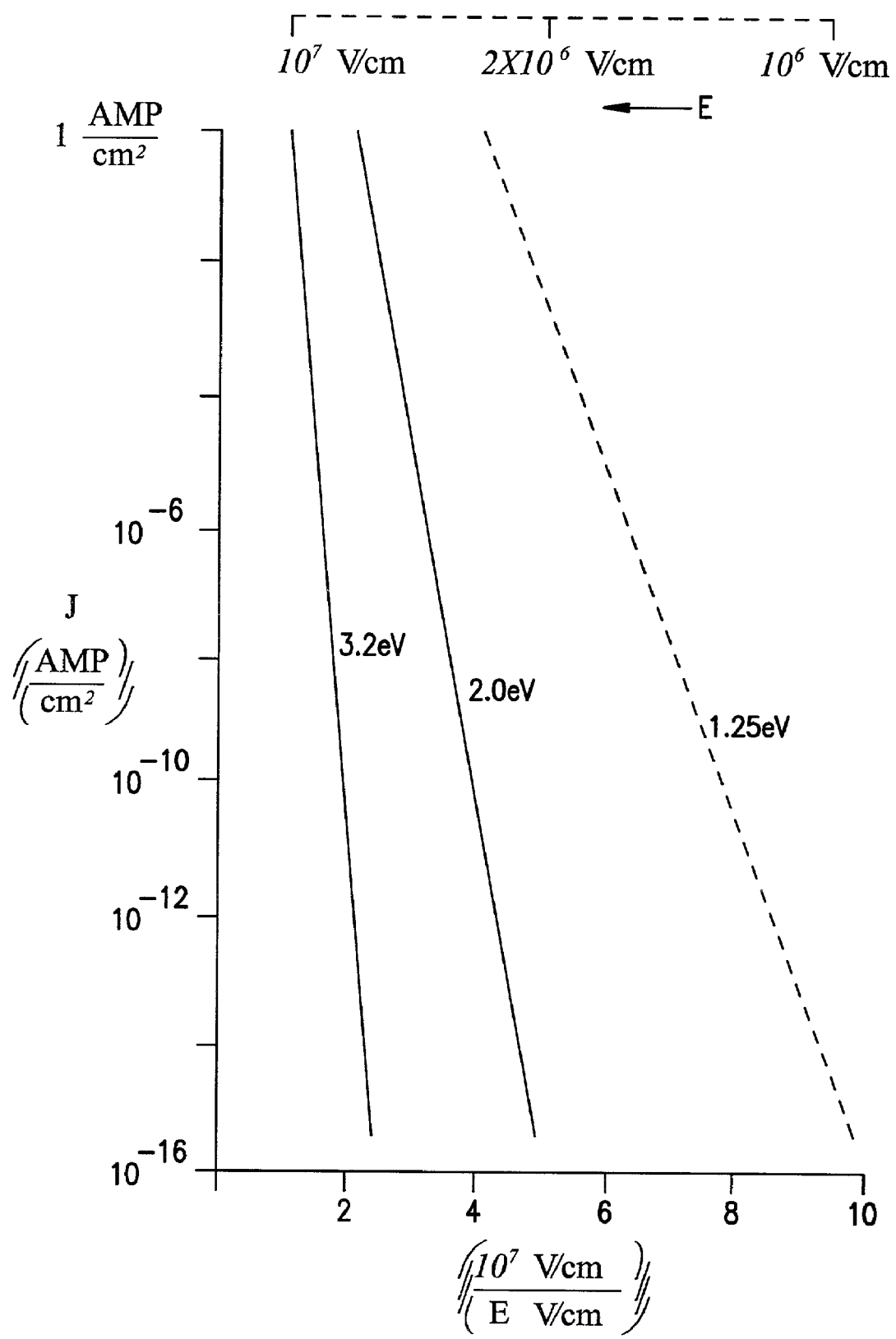
FIG. 7C is a graph plotting tunneling currents versus the applied electric fields (reciprocal applied electric field shown) for an number of barrier heights.

FIG. 7C is a graph plotting tunneling currents versus the applied electric fields (reciprocal applied electric field shown) for an number of barrier heights. FIG. 7C illustrates the dependence of the tunneling currents on electric field (reciprocal applied electric field) and barrier height. The fraction of voltage across the interpoly or intergate insulator, $\Delta V2$, can be increased by making the area of the intergate capacitor, C2, (e.g. intergate insulator 707) smaller than the area of the transistor gate capacitor, C1 (e.g. gate oxide 703). This would be required with high dielectric constant intergate dielectric insulators 707 and is easily realized with the vertical floating gate structures described above in connection with FIGS. 3, and 5A–5E.

Methods of Formation

Several examples are outlined below in order to illustrate how a diversity of such metal oxide tunnel barriers can be formed, according to the teachings of the present invention. Processing details and precise pathways taken which are not expressly set forth below will be obvious to one of ordinary skill in the art upon reading this disclosure. Firstly, although not included in the details below, it is important also to take into account the following processing factors in connection with the present invention:

(i) The poly-Si layer is to be formed with emphasis on obtaining a surface that is very smooth and morphologically stable at subsequent device processing temperatures which will exceed that used to grow Metal oxide.

(ii) The native SiO$_x$ oxide on the poly-Si surface must be removed (e.g., by sputter cleaning in an inert gas plasma in situ) just prior to depositing the metal film. The electrical characteristics of the resultant Poly-Si/Metal/Metal oxide/Metal/Poly-Si structure will be better defined and reproducible than that of a Poly-Si/Native SiO$_x$/Metal/Metal oxide/Poly-Si structure.

(iii) The oxide growth rate and limiting thickness will increase with oxidation temperature and oxygen pressure. The oxidation kinetics of a metal may, in some cases, depend on the crystallographic orientations of the very small grains of metal which comprise the metal film (see generally, O, Kubaschewski and B. E. Hopkins, "Oxidation of Metals and Alloys", Butterworth, London, pp. 53–64, 1962). If such effects are significant, the metal deposition process can be modified in order to increase its preferred orientation and subsequent oxide thickness and tunneling uniformity. To this end, use can be made of the fact that metal films strongly prefer to grow during their depositions having their lowest free energy planes parallel to the film surface. This preference varies with the crystal structure of the metal. For example, fcc metals prefer to form {111} surface plans. Metal orientation effects, if present, would be larger when only a limited fraction of the metal will be oxidized and unimportant when all or most of the metal is oxidized.

(iv) Modifications in the structure shown in FIG. 2 may be introduced in order to compensate for certain properties in some metal/oxide/metal layers. Such changes are reasonable since a wide range of metals, alloys and oxides with quite different physical and chemical properties can be used to form these tunnel junctions.

EXAMPLE I

Formation of PbO Tunnel Barriers

This oxide barrier has been studied in detail using Pb/PbO/Pb structures. The oxide itself can be grown very controllably on deposited lead films using either thermal oxidation (see generally, J. M. Eldridge and J. Matisoo, "Measurement of tunnel current density in a Meal-Oxide-Metal system as a function of oxide thickness," Proc. $12^{th}$ Intern. Conf. on Low Temperature Physics, pp. 427–428, 1971; J. M. Eldridge and D. W. Dong, "Growth of thin PbO layers on lead films. I. Experiment," Surface Science, Vol. 40, pp. 512–530, 1973) or rf sputter etching in an oxygen plasma (see generally, J. H. Greiner, "Oxidation of lead films by rf sputter etching in an oxygen plasma", J. Appl. Phys., Vol. 45, No. 1, pp. 32–37, 1974). It will be seen that there are a number of possible variations on this structure. Starting with a clean poly-Si substrate, one processing sequence using thermal oxidation involves:

(i) Depositing a clean lead film on the poly-Si floating gate at ~25 to 75C in a clean vacuum system having a base pressure of ~$10^{-8}$ Torr or lower. The Pb film will be very thin with a thickness within 1 or 2A of its target value.

(ii) Lead and other metal films can be deposited by various means including physical sputtering and/or from a Knudsen evaporation cell. The sputtering process also offers the ability to produce smoother films by increasing the re-sputtering-to-deposition ratio since re-sputtering preferentially reduces geometric high points of the film.

Figure 1A:
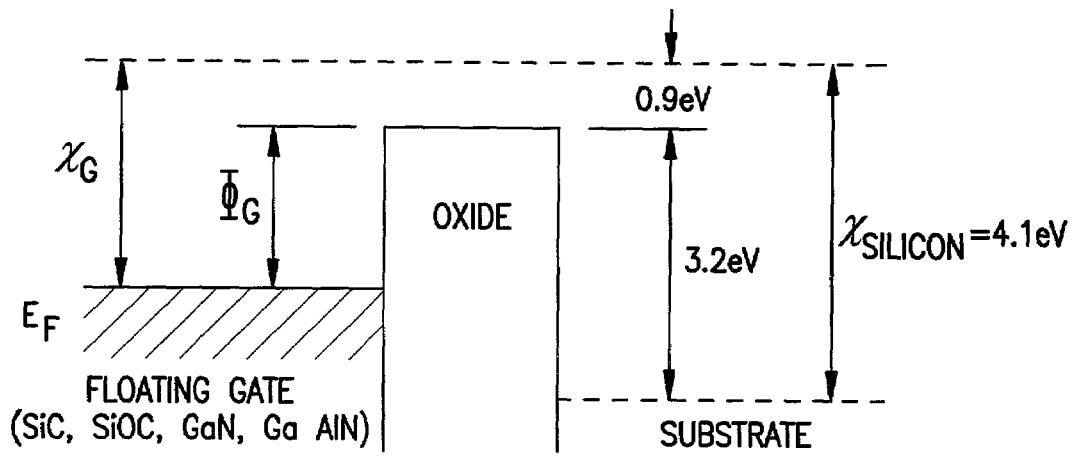
FIGS. 1A–1C illustrate a number of previous methods for reducing tunneling barriers in Flash memory.
Figure 1B:
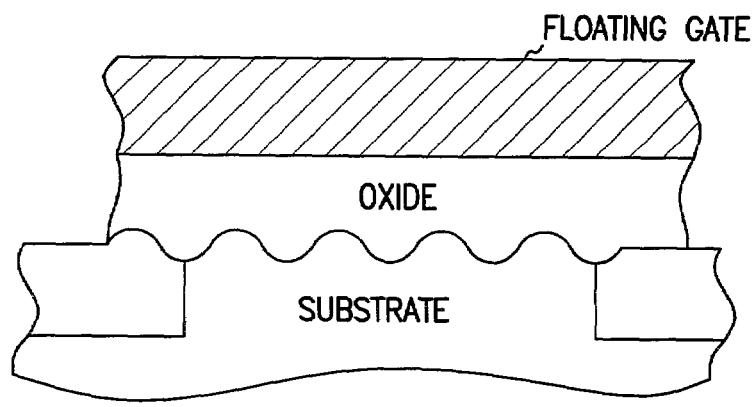
Figure 1C:
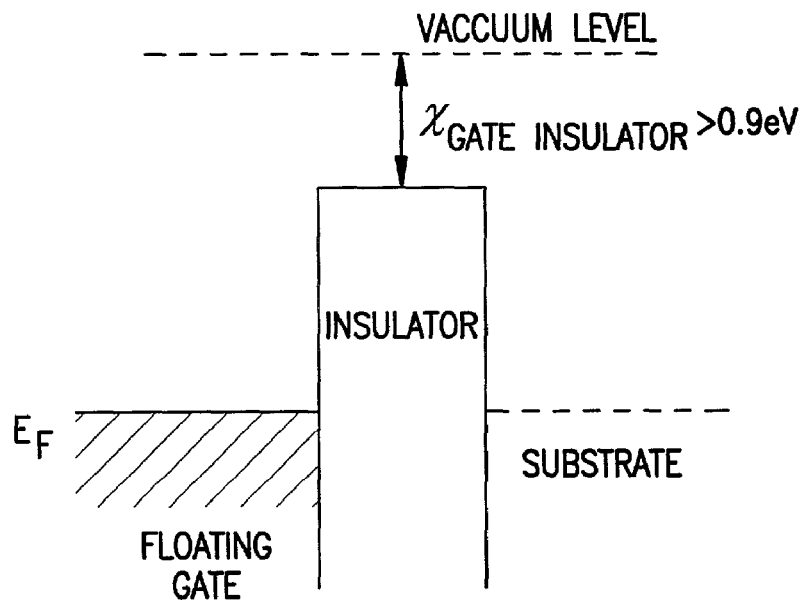

(iii) Using a "low temperature oxidation process" to grow an oxide film of self-limited thickness. In this case, oxygen gas is introduced at the desired pressure in order to oxidize the lead in situ without an intervening exposure to ambient air. For a fixed oxygen pressure and temperature, the PbO thickness increases with log(time). Its thickness can be controlled via time or other parameters to within 0.10 A, as determined via in situ ellipsometric or ex situ measurements of Josephson tunneling currents. This control is demonstrated by the very limited statistical scatter of the current PbO thickness data shown in the insert of FIG. 3 in an article by J. M. Eldridge and J. Matisoo, entitled "Measurement of tunnel current density in a Meal-Oxide-Metal system as a function of oxide thickness," Proc. $12^{th}$ Intern. Conf. on Low Temperature Physics, pp. 427–428, 1971. This remarkable degree of control over tunnel current is due to the excellent control over PbO thickness that can be achieved by "low temperature oxidation." For example, increasing the oxidation time from 100 to 1,000 minutes at an oxygen pressure of 750 Torr at 25 C only raises the PbO thickness by 3 A (e.g., from ~21 to 24 A, see FIG. 1 in J. M. Eldridge and J. Matisoo, "Measurement of tunnel current density in a Meal-Oxide-Metal system as a function of oxide thickness," Proc. $12^{th}$ Intern. Conf. on Low Temperature Physics, pp. 427–428, 1971). Accordingly, controlling the oxidation time to within 1 out of a nominal 100 minute total oxidation time provides a thickness that is within 0.1 A of 21A. The PbO has a highly stoichiometric composition throughout its thickness, as evidenced from ellipsometry (e.g., see FIG. 6 in J. M. Eldridge and D. W. Dong, "Growth of thin PbO layers on lead films. I. Experiment," Surface Science, Vol. 40, pp. 512–530, 1973) and the fact that the tunnel barrier heights are identical for Pb/PbO/Pb structures.

(iv) Re-evacuate the system and deposit the top lead electrode. This produces a tunnel structure having virtually identical tunnel barriers at both Pb/O interfaces.

(v) The temperature used to subsequently deposit the Poly-Si control gate must be held below the melting temperature (327 C) of lead. The PbO itself is stable (up to ~500 C or higher) and thus introduces no temperature constraint on subsequent processes. One may optionally oxidize the lead film to completion, thereby circumventing the low melting temperature of metallic lead. In this case, one would form a Poly-Si/PbO/Poly-Si tunnel structure having an altered tunnel barrier for charge injection. Yet another variation out of several would involve: oxidizing the lead film to completion; replacing the top lead electrode with a higher melting metal such as Al; and, then adding the poly-Si control layer. This junction would have asymmetrical tunneling behavior due to the difference in barrier heights between the Pb/PbO and PbO/Al electrodes.

EXAMPLE II

Formation of $Al_2O_3$ Tunnel Barriers

A number of studies have dealt with electron tunneling in Al/$Al_2O_3$/Al structures where the oxide was grown by "low temperature oxidation" in either molecular or plasma oxygen (see generally, S. M. Sze, Physics of Semiconductor Devices, Wiley, NY, pp. 553–556, 1981; G. Simmons and A. El-Badry, "Generalized formula for the electric tunnel effect between similar electrodes separated by a thin insulating film," J. Appl. Phys., Vol. 34, p. 1793, 1963; S. R. Pollack and C. E. Morris, "Tunneling through gaseous oxidized films of $Al_2O_3$," Trans. AIME, Vol. 233, p. 497, 1965; Z. Hurych, "Influence of nonuniform thickness of dielectric layers on capacitance and tunnel currents," Solid-State Electronics, Vol. 9, p. 967, 1966; S. P. S. Arya and H. P. Singh, "Conduction properties of thin $Al_2O_3$ films," Thin Solid Films, Vol. 91, No. 4, pp. 363–374, May 1982; K.-H. Gundlach and J. Holzl, "Logarithmic conductivity of Al—$Al_2O_3$—Al tunneling junctions produced by plasma- and by thermal-oxidation", surface Science, Vol. 27, pp. 125–141, 1971). Before sketching out a processing sequence for these tunnel barriers, note:

(i) Capacitance and tunnel measurements indicate that the $Al_2O_3$ thickness increases with the log (oxidation time), similar to that found for PbO/Pb as well as a great many other oxide/metal systems.

(ii) Tunnel currents are asymmetrical in this system with somewhat larger currents flowing when electrons are injected from Al/$Al_2O_3$ interface developed during oxide growth. This asymmetry is due to a minor change in composition of the growing oxide: there is a small concentration of excess metal in the $Al_2O_3$, the concentration of which diminishes as the oxide is grown thicker. The excess $Al^{+3}$ ions produce a space charge that lowers the tunnel barrier at the inner interface. The oxide composition at the outer $Al_2O_3/Al$ contact is much more stoichiometric and thus has a higher tunnel barrier. In situ ellipsometer measurements on the thermal oxidation of Al films deposited and oxidized in situ support this model (see generally, J. Grimblot and J. M. Eldridge, "I. Interaction of Al films with $O_2$ at low pressures", J. Electro. Chem. Soc., Vol. 129, No. 10, pp. 2366–2368, 1982. J. Grimblot and J. M. Eldridge, "II. Oxidation of Al films", ibid, 2369–2372, 1982). In spite of this minor complication, $Al/Al_2O_3/Al$ tunnel barriers can be formed that will produce predictable and highly controllable tunnel currents that can be ejected from either electrode. The magnitude of the currents are still primarily dominated by $Al_2O_3$ thickness which can be controlled via the oxidation parametrics.

With this background, we can proceed to outline one process path out of several that can be used to form $Al_2O_3$ tunnel barriers. Here the aluminum is thermally oxidized although one could use other techniques such as plasma oxidation (see generally, S. R. Pollack and C. E. Morris, "Tunneling through gaseous oxidized films of $Al_2O_3$," Trans. AIME, Vol. 233, p. 497, 1965; K.-H. Gundlach and J. Holzl, "Logarithmic conductivity of $Al$—$Al_2O_3$—$Al$ tunneling junctions produced by plasma- and by thermal-oxidation", Surface Science, Vol. 27, pp. 125–141, 1971) or rf sputtering in an oxygen plasma (see generally, J. H. Greiner, "Oxidation of lead films by rf sputter etching in an oxygen plasma", J. Appl. Phys., Vol. 45, No. 1, pp. 32–37, 1974). For the sake of brevity, some details noted above will not be repeated. The formation of the $Al/Al_2O_3/Al$ structures will be seen to be simpler than that described for the Pb/PbO/Pb junctions owing to the much higher melting point of aluminum, relative to lead.

(i) Sputter deposit aluminum on poly-Si at a temperature of ~25 to 150C. Due to thermodynamic forces, the microcrystallites of the f.c.c. aluminum will have a strong and desirable (111) preferred orientation.

(ii) Oxidize the aluminum in situ in molecular oxygen using temperatures, pressure and time to obtain the desired $Al_2O_3$ thickness. As with PbO, the thickness increases with log (time) and can be controlled via time at a fixed oxygen pressure and temperature to within 0.10 Angstroms, when averaged over a large number of aluminum grains that are present under the counter-electrode. One can readily change the $Al_2O_3$ thickness from ~15 to 35 A by using appropriate oxidation parametrics (e.g., see FIG. 2 in J. Grimblot and J. M. Eldridge, "II. Oxidation of Al films", J. Electro. Chem. Soc., Vol. 129, No. 10, pp. 2369–2372, 1982). The oxide will be amorphous and remain so until temperatures in excess of 400 C are reached. The initiation of recrystallization and grain growth can be suppressed, if desired, via the addition of small amounts of glass forming elements (e.g., Si) without altering the growth kinetics or barrier heights significantly.

(iii) Re-evacuate the system and deposit a second layer of aluminum.

(iv) Deposit the Poly-Si control gate layer using conventional processes.

EXAMPLE III

Formation of Single- and Multi-Layer Transition Metal Oxide Tunnel Barriers

Single layers of $Ta_2O_5$, $TiO_2$, $ZrO_2$, $Nb_2O_5$ and similar transition metal oxides can be formed by "low temperature oxidation" of numerous Transition Metal (e.g., TM oxides) films in molecular and plasma oxygen and also by rf sputtering in an oxygen plasma. The thermal oxidation kinetics of these metals have been studied for decades with numerous descriptions and references to be found in the book by Kubaschewski and Hopkins (O. Kubaschewski and B. E. Hopkins, "Oxidation of Metals and Alloys", Butterworth, London, pp. 53–64, 1962). In essence, such metals oxidize via logarithmic kinetics to reach thicknesses of a few to several tens of angstroms in the range of 100 to 300 C. Excellent oxide barriers for Josephson tunnel devices can be formed by rf sputter etching these metals in an oxygen plasma (see generally, J. M. Greiner, "Josephson tunneling barriers by rf sputter etching in an oxygen plasma," J. Appl. Phys., Vol. 42, No. 12, pp. 5151–5155, 1971; O. Michikami et al., "Method of fabrication of Josephson tunnel junctions," U.S. Pat. No. 4,412,902, Nov. 1, 1983). Such "low temperature oxidation" approaches differ considerably from MOCVD processes used to produce these TM oxides. MOCVD films require high temperature oxidation treatments to remove carbon impurities, improve oxide stoichiometry and produce recrystallization. Such high temperature treatments also cause unwanted interactions between the oxide and the underlying silicon and thus have necessitated the introduction of interfacial barrier layers. See, for example, H. F. Luan et al., "High quality $Ta_2O_5$ gate dielectrics with $T_{ox,eq}$<10 angstroms," IEDM Tech. Digest, pp. 141–144, 1999.

A new approach was described in a copending application by J. M. Eldridge, entitled "Thin Dielectric Films for DRAM Storage Capacitors," patent application Ser. No. 09/651,380 filed Aug. 29, 2000 that utilizes "low temperature oxidation" to form duplex layers of TM oxides. Unlike MOCVD films, the oxides are very pure and stoichiometric as formed. They do require at least a brief high temperature (est. 700 to 800 C but may be lower) treatment to transform their microstructures from amorphous to crystalline and thus increase their dielectric constants to the desired values (>20 or so). Unlike MOCVD oxides, this treatment can be carried out in an inert gas atmosphere, thus lessening the possibility of inadvertently oxidizing the poly-Si floating gate. While this earlier disclosure was directed at developing methods and procedures for producing high dielectric constant films for storage cells for DRAMs, the same teachings can be applied to producing thinner metal oxide tunnel films for the flash memory devices described in this disclosure. The dielectric constants of these TM oxides are substantially greater (>25 to 30 or more) than those of PbO and $Al_2O_3$. Duplex layers of these high dielectric constant oxide films are easily fabricated with simple tools and also provide improvement in device yields and reliability. Each oxide layer will contain some level of defects but the probability that such defects will overlap is exceedingly small. Effects of such duplex layers were first reported by one J. M. Eldridge of the present authors and are well known to practitioners of the art. It is worth mentioning that highly reproducible TM oxide tunnel barriers can be grown by rf sputtering in an oxygen ambient, as referenced above (see generally, J. M. Greiner, "Josephson tunneling barriers by rf sputter etching in an oxygen plasma," J. Appl. Phys., Vol. 42, No. 12, pp. 5151–5155, 1971; O. Michikami et al., "Method of fabrication of Josephson tunnel junctions," U.S. Pat. No. 4,412,902, Nov. 1, 1983). Control over oxide thickness and other properties in these studies were all the more remarkable in view of the fact that the oxides were typically grown on thick (e.g., 5,000 A) metals such as Nb and Ta. In such metal-oxide systems, a range of layers and suboxides can also form, each having their own properties. In the present disclosure, control over the properties of the various TM oxides will be even better since we employ very limited (perhaps 10 to 100 A or so) thicknesses of metal and thereby preclude the formation of significant quantities of unwanted, less controllable sub-oxide films. Thermodynamic forces will drive the oxide compositions to their most stable, fully oxidized state, e.g., $Nb_2O_5$, $Ta_2O_5$, etc. As noted above, it will still be necessary to crystallize these duplex oxide layers. Such treatments can be done by RTP and will be shorter than those used on MOCVD and sputter-deposited oxides since the stoichiometry and purity of the "low temperature oxides" need not be adjusted at high temperature.

Fairly detailed descriptions for producing thicker duplex layers of TM oxides have been given in the copending application by J. M. Eldridge, entitled "Thin Dielectric Films for DRAM Storage Capacitors," patent application Ser. No. 09/651,380 filed Aug. 29, 2000, so there is no need to repeat them here. Although perhaps obvious to those skilled in the art, one can sketch out a few useful fabrication guides:

(i) Thinner TM layers will be used in this invention relative to those used to form DRAMs. Unlike DRAMs where leakage must be eliminated, the duplex oxides used here must be thin enough to carry very controlled levels of current flow when subjected to reasonable applied fields and times.

(ii) The TM and their oxides are highly refractory and etchable (e.g., by RIE). Hence they are quite compatible with poly-Si control gate processes and other subsequent steps.

(iii) TM silicide formation will not occur during the oxidation step. It could take place at a significant rate at the temperatures used to deposit the poly-Si control gate. If so, several solutions can be applied including:

(i) Insert certain metals at the TM/poly-Si boundaries that will prevent inter-diffusion of the TM and the poly-Si.

(ii) Completely oxide the TMs. The electrical characteristics of the resulting poly-Si/TM oxide 1/TM oxide 2/poly-Si structure will be different in the absence of having TM at the oxide/metal interfaces.

EXAMPLE IV

Formation of Alternate Metal Compound Tunnel Barriers

Although no applications may be immediately obvious, it is conceivable that one might want to form a stack of oxide films having quite different properties, for example, a stack comprised of a high dielectric constant (k) oxide/ a low k oxide/ a high k oxide. "Low temperature oxidation" can be used to form numerous variations of such structures. While most of this disclosure deals with the formation and use of stacks of oxide dielectrics, it is also possible to use "low temperature oxidation" to form other thin film dielectrics such as nitrides, oxynitrides, etc. that could provide additional functions such as being altered by monochromatic light, etc. These will not be discussed further here.

EXAMPLE V

Formation of Perovskite Oxide Tunnel Barriers

Some results have been obtained which demonstrate that at least a limited range of high temperature, super-conducting oxide films can be made by thermally oxidizing Y—Ba—Cu alloy films (see generally, Hase et al., "Method of manufacturing an oxide superconducting film," U.S. Pat. No. 5,350,738, Sept. 27, 1994). The present inventors have also disclosed how to employ "low temperature oxidation" and short thermal treatments in an inert ambient at 700 C in order to form a range of perovskite oxide films from parent alloy films (see generally, J. M. Eldridge, "Low Cost Processes for Producing High Quality Perovskite Dielectric Films," application Ser. No. 09/945,137). The dielectric constants of crystallized, perovskite oxides can be very large, with values in the 100 to 1000 or more range. The basic process is more complicated than that needed to oxidize layered films of transition metals. (See Example III.) The TM layers would typically be pure metals although they could be alloyed. The TMs are similar metallurgically as are their oxides. In contrast, the parent alloy films that can be converted to a perovskite oxide are typically comprised of metals having widely different chemical reactivities with oxygen and other common gasses. In the Y—Ba—Cu system referenced above, Y and Ba are among the most reactive of metals while the reactivity of Cu approaches (albeit distantly) those of other noble metals. If the alloy is to be completely oxidized, then thin film barriers such as Pd, Pt, etc. or their conductive oxides must be added between the Si and the parent metal film to serve as: electrical contact layers; diffusion barriers; and, oxidation stops. In such a case, the Schottky barrier heights of various TM oxides and perovskite oxides in contact with various metals will help in the design of the tunnel device. In the more likely event that the perovskite parent alloy film will be only partially converted to oxide and then covered with a second layer of the parent alloy (recall the structure of FIG. 2), then the barrier heights will represent that developed during oxide growth at the parent perovskite alloy/perovskite oxide interface. Obviously, such barrier heights cannot be predicted ab initio for such a wide class of materials but will have to be developed as the need arises. This information will have to be developed on a system-by-system basis.

Methods of Operation

Write Operation

Write can be achieved by the normal channel hot electron injection and gate current through the silicon oxide to the floating gate. This is done by selecting a particular column by applying a high control gate voltage and applying relatively large drain voltage as is done with conventional ETOX flash memory devices. However, according to the teachings of the present invention, write can also be accomplished by applying a positive voltage to the substrate or well select line and a large negative voltage to the control gates, electrons will tunnel from the control gate to the floating gate. The low tunnel barrier will provide an easy write operation and the selection of the substrate or well bias will provide selectivity and address only one device.

Erase Operation

According to the teachings of the present invention, erase is achieved by providing a negative voltage to the substrate or well address line and a large positive voltage to the control gate. This causes electrons to tunnel off of the floating gate on to the control gate. A whole row can be erased by addressing all the column lines along that row and a block can be erased by addressing multiple row back gate or substrate/well address lines.

Read Operation

Read is accomplished as in conventional ETOX flash memory devices. A column line is addressed by applying a positive control gate voltage and sensing the current along the data bit or drain row address line.

System Level

Figure 8:
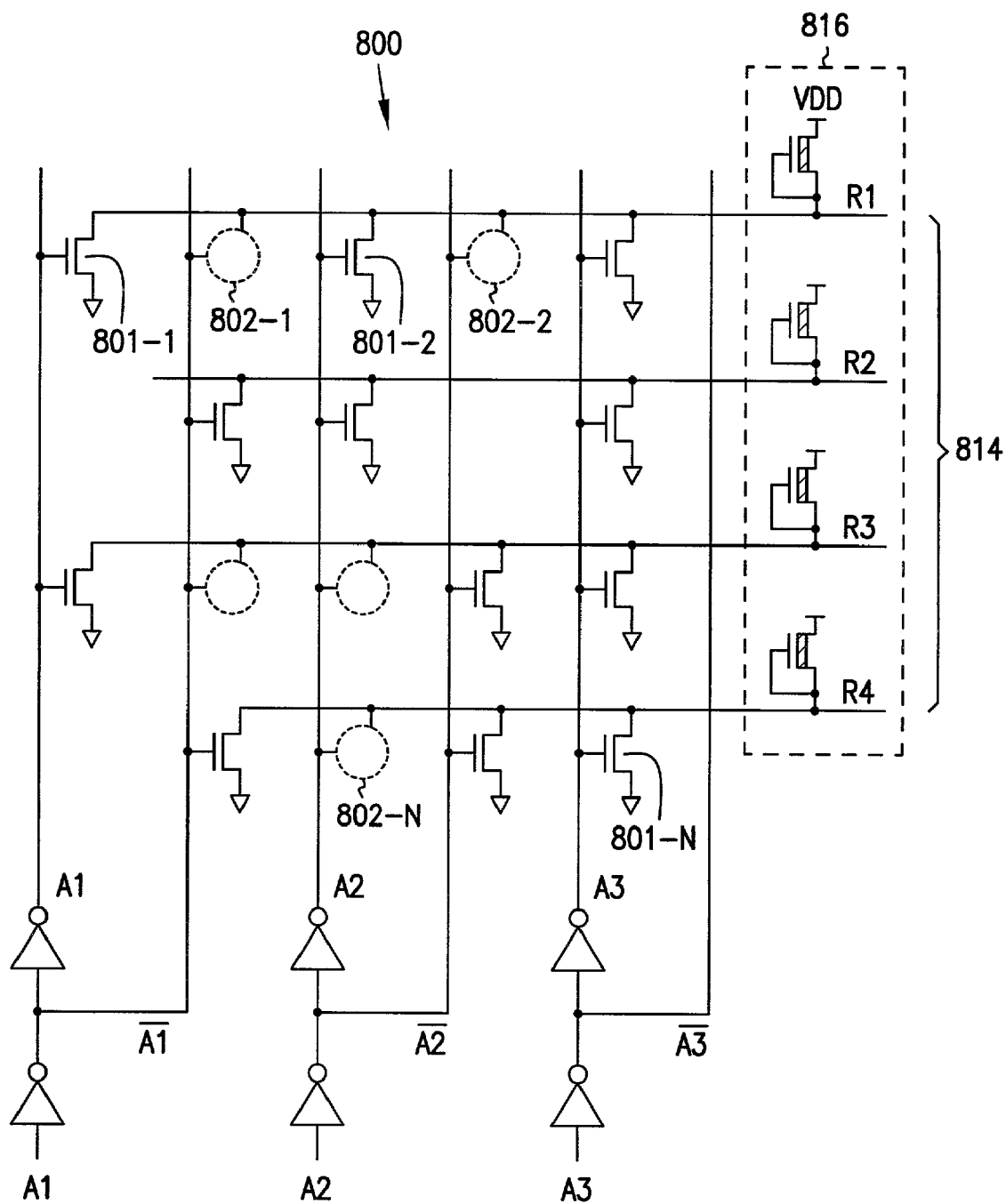
FIG. 8 shows a conventional NOR decode array for memory circuits according to the teachings of the prior art.

FIG. 8 shows a conventional NOR decode array 800 for memory circuits. The address lines are A1 through A3 and inverse address lines, $\overline{A1}$ through $\overline{A3}$. The conventional NOR decode array is programmable at the gate mask level by either fabricating a thin oxide gate transistor, e.g. transistors 801-1, 801-2, . . . , 801-N, at the intersection of lines in the array or not fabricating a thin oxide gate transistor, e.g. missing thin oxide transistors, 802-1, 802-2, . . . , 802-N, at such an intersection. As one of ordinary skill in the art will understand upon reading this disclosure, the same technique is conventionally used to form other types of decode arrays not shown. As shown in FIG. 8, a number of depletion mode NMOS transistors, 816, are used as load devices.

In this embodiment, each of the row lines 814 acts as a NOR gate for the address lines A1 through A3 and inverse address lines, $\overline{A1}$ through $\overline{A3}$ that are connected to the row lines 814 through the thin oxide gate transistor, e.g. transistors 801-1, 801-2, . . . , 801-N, of the array. That is, row line R1 is maintained at a high potential, +VDD, in the positive logic NMOS decode array shown in FIG. 8A, unless one or more of the thin oxide gate transistor, e.g. transistors 801-1, 801-2, . . . , 801-N, that are coupled to row line R1 are turned on by a high logic level signal, +VDD, on one of the address lines A1 through A3 or inverse address lines, A1 through A3. When a transistor gate address is activated, by the high logic level signal, +VDD, through address lines A1 through A3 or inverse address lines, $\overline{A1}$ through $\overline{A3}$, each thin oxide gate transistor, e.g. transistors 801-1, 801-2, . . . , 801-N, conducts, or is turned "on." This conduction of the thin oxide gate transistor, e.g. transistors 801-1, 801-2, . . . , 801-N, performs the NOR positive logic circuit function, an inversion of the OR circuit function results from inversion of data onto the row lines 814 through the thin oxide gate transistor, e.g. transistors 801-1, 801-2, . . . , 801-N, of the array, in order to output a low logic level signal on the row lines 814. Thus, a particular row line 814 is addressed when none of the thin oxide gate transistor, e.g. transistors 801-1, 801-2, . . . , 801-N, coupled to that row line 814 are turned "on."

Again, the incoming address on each line is inverted and the combination of the original address and inverted or complemented values used to drive the gates of transistors in the decode array 800. The transistors 801-1, 801-2, . . . , 801-N in the array 800 are enhancement mode NMOS devices and depletion mode NMOS transistors are used as load devices 816. All voltages are positive in a simple NMOS circuit. This is a positive logic NOR decode array, the logic one state, "1" is the most positive voltage, +VDD, and the logic level zero, "0" is the least positive voltage or ground.

The transistors used in FIG. 8 are NMOS driver transistors with a depletion mode NMOS load technology. The load device or NMOS load transistor is a depletion mode or normally "on" transistor which acts as a constant current source during the pull up switching transient thus providing high switching speed. The driver transistor is an enhancement mode NMOS transistor which is normally "off" with zero gate bias.

Figure 9:
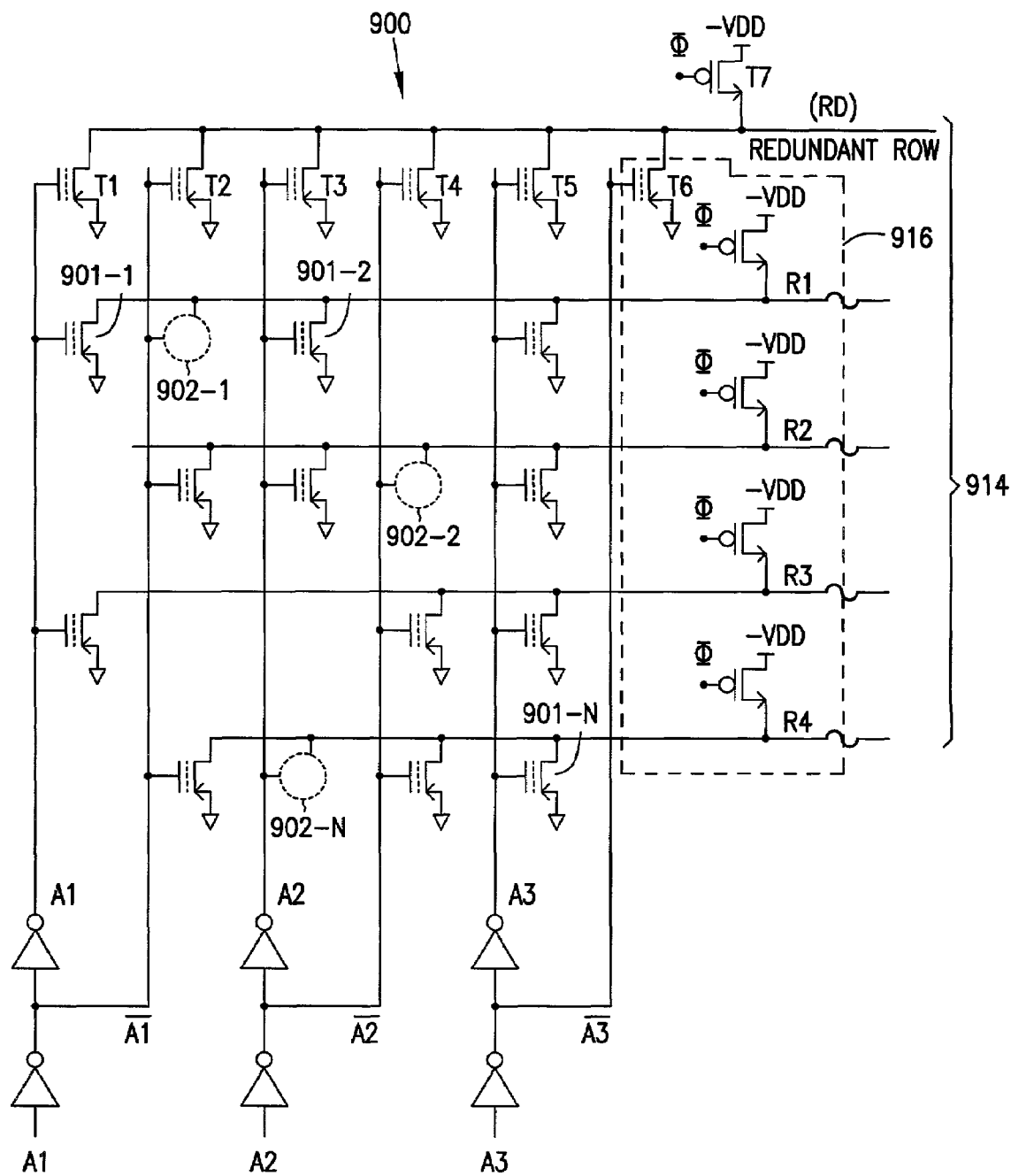
FIG. 9 is a schematic diagram illustrating an embodiment of a decode circuit, or memory address decoder, according to the teachings of the present invention.

FIG. 9 is a schematic diagram illustrating one embodiment of a decode circuit, or memory address decoder, 900 according to the teachings of the present invention. Analogous to FIG. 8, the address lines are A1 through A3 and inverse address lines, $\overline{A1}$ through $\overline{A3}$. As shown in FIG. 9, the decode circuit 900 is programmable at the gate mask level by either fabricating a driver transistor, or logic cell, e.g. transistors 901-1, 901-2, . . . , 901-N, at the intersection of lines in the array or not fabricating a driver transistor, or logic cell, e.g. missing floating gate driver transistors 902-1, 902-2, . . . , 902-N, at such an intersection. In one embodiment according to the teachings of the present invention, fabricating a driver transistor, e.g. transistors 901-1, 901-2, . . . , 901-N, at the intersection of lines in the array includes fabricating the floating gate driver transistor according to the embodiments discussed and described in detail in connection with FIGS. 5 and 6. In one embodiment of the present invention, as shown in FIG. 9, a number of p-channel metal oxide semiconductor (PMOS) load transistors, 916, are used as load devices and are coupled to the output lines, or row lines, 914, of the decode circuit 900.

The incoming address on each address line A1 through A3 is inverted and the combination of the original address on each address line A1 through A3 and inverted or complemented values on inverse address lines, $\overline{A1}$ through $\overline{A3}$, used to drive the control gates of transistors 901-1, 901-2, . . . , 901-N in the decode array 900. The floating gate driver transistors, or logic cells, e.g. transistors 901-1, 901-2, . . . , 901-N in the decode array 900 are n-channel floating gate driver transistors having a low tunnel barrier intergate insulator between the control gate and floating gate as described above in connection with FIGS. 5 and 6.

In FIG. 9, each of the row lines 914 acts as a NOR gate for the address lines A1 through A3 and inverse address lines, $\overline{A1}$ through $\overline{A3}$ that are connected to the row lines 914 through the floating gate driver transistors, or logic cells, e.g. transistors 901-1, 901-2, . . . , 901-N, of the array 900. That is, row line R1 is maintained at a high potential VDD, or logic "1" unless one or more of the floating gate driver transistors, or logic cells, e.g. transistors 901-1, 901-2, . . . , 901-N, that are coupled to row line R1 are turned on by a high logic level signal, VDD, on one of the address lines A1 through A3 or inverse address lines, $\overline{A1}$ through $\overline{A3}$. In the decode circuit 900 configuration shown in FIG. 9, a logic "1", or VDD, on one of the address lines A1 through A3 or inverse address lines, $\overline{A1}$ through $\overline{A3}$, is required in order to turn on one of the n-channel floating gate driver transistors, or logic cells, e.g. transistors 901-1, 901-2, . . . , 901-N, coupled to row line R1. As one of ordinary skill in the art will understand upon reading this disclosure, the floating gate driver transistors, or logic cells, e.g. transistors 901-1, 901-2, . . . , 901-N, can be programmed to have two different conductivity states depending upon whether electrons are stored on the floating gate. When a charge is stored on the floating gate for any one of these floating gate driver transistors, 901-1, 901-2, . . . , 901-N, the floating gate transistor is effectively removed from the programmable memory address and decode circuit 900.

For the decode circuit 900 of the present invention, shown in FIG. 9, the driver transistors, e.g. transistors 901-1, 901-2, . . . , 901-N in the array are floating gate transistor devices. In one embodiment, the floating gate driver transistors 9011, 901-2, . . . , 901-N are formed according to the embodiments of the present invention as disclosed and described in detail in connection with FIGS. 5 and 6. In this manner, the floating gate driver transistors, 901-1, 901-2, . . . , 901-N, can be programmed initially in fabrication and can be reprogrammed as necessary once the decode array is in service, e.g. field programmable, to implement a specific decode function. The load devices 916, shown in the address decoder 900 of FIG. 9, are p-channel metal oxide semiconductor (PMOS) transistors and not depletion mode n-channel transistors as is more usual. In this manner, the decode circuit 900 embodiment of the present invention shown in FIG. 9 is formed according to a CMOS process and can be referred to as a CMOS decode array 900.

In one embodiment, as shown in FIG. 9, the decode circuit 900 of the present invention includes at least one redundant row line, RD. In the embodiment shown in FIG. 9, a number of additional floating gate driver transistors, e.g. transistors T1–T6, are provided in the array coupled to address lines A1 through A3 or inverse address lines, $\overline{A1}$ through $\overline{A3}$ and the redundant row line, RD. According to the teachings of the present invention, these additional driver transistors, e.g. transistors T1–T6, are formed according to the embodiments described and discussed in detail above in connection with FIGS. 5 and 6. In one embodiment, as described above according to the teachings of the present invention, the additional floating gate driver transistors, T1–T6, will have a vertical control gate formed by the address lines A1 through A3 or inverse address lines, $\overline{A1}$ through $\overline{A3}$. In another embodiment, as described above according to the teachings of the present invention, the additional floating gate driver transistors, T1–T6, will have a horizontal control gate formed by the address lines A1 through A3 or inverse address lines, $\overline{A1}$ through $\overline{A3}$ located above the floating gates of the floating gate driver transistors, T1–T6. According to the teachings of the present invention, the second source/drain region for the additional driver transistors, T1–T6, are coupled to the at least one redundant row line, or wordline, RD. A p-channel metal oxide semiconductor (PMOS) load transistor T7, similar to p-channel metal oxide semiconductor (PMOS) load transistors 916 is coupled to the at least one redundant row line, RD as well to complete the CMOS inverter configuration.

As has been shown and described above, these non volatile, floating gate driver transistors, e.g. transistors T1–T6, can be programmed to have two different conductivity states depending upon whether electrons are stored on the vertical floating gate. When a charge is stored on the floating gate for any one of these floating gate driver transistors, e.g. transistors T1–T6, the floating gate transistor is effectively removed from the programmable memory address and decode circuits 900 of the present invention. The implementation of these floating gate driver transistors, e.g. transistors T1–T6, in the decode circuit 900 of the present invention, enables error correction for replacing a row, or column in the array as one of ordinary skill in the art will understand upon reading this disclosure.

According to the teachings of the present invention, it is desirable to have redundant row lines, e.g. redundant row line RD, available to replace or error correct for row lines 914, which are determined defective or which have failed in the field. The present invention is usable to provide such error correction by replacing a row, or column, in a memory decode circuit 900.

One of ordinary skill in the art will understand upon reading this disclosure that there can be more than one redundant row line, e.g. a RD2, RD3, etc. (not shown), and similarly more additional floating gate driver transistors, like transistors T1–T6, coupled thereto in order to enable multiple row error correction. One of ordinary skill in the art will further understand, upon reading this disclosure, the manner in which the additional floating gate driver transistors, T1–T6, formed according to the teachings of the present invention, can be selectively programmed in order to access, or select, redundant rows RD in replacement for any one of the output lines 914 in the decode array 900.

In summary, If electrons are stored on a floating gate for one of the additional floating gate driver transistors, T1–T6, then when a high input signal is received on address lines A1 through A3 or inverse address lines, $\overline{A1}$ through $\overline{A3}$, the "programmed floating gate driver transistor, T1–T6, will remain "off." On the other hand, if there is no stored charge on the vertical floating gate for that particular floating gate driver transistors, T1–T6, then the floating gate driver transistors, T1–T6, will conduct when a high input signal is received on address lines A1 through A3 or inverse address lines, $\overline{A1}$ through $\overline{A3}$ associated with that floating gate driver transistor. If the floating gate driver transistors, T1–T6, have no charge stored on the floating gate they will function as normal inverters for the decode circuit 900. Conversely, if there is a charge stored charge on the floating gate, the conductivity of the floating gate driver transistors, T1–T6, will not become high enough and will not function as a driver transistor. In this latter case, the output for the redundant row line RD in the decode circuit 900 of the present invention will not change charge states. Hence, if there is a charge stored on the vertical floating gate of the floating gate driver transistors, T1–T6, the drivers are effectively removed from the decode circuits 900.

Analogously, the decode circuit shown in FIG. 9 can represent a column decode circuit 900. In this case, the lines 914 or redundant line RD which are coupled to the address lines A1 through A3 or inverse address lines, $\overline{A1}$ through $\overline{A3}$ through the floating gate driver transistors, 901-1, 901-2, . . . , 901-N and T1–T6, can be complementary bit lines for column decoding as the same will be know and understood by one of ordinary skill in the art.

As one of ordinary skill in the art will further understand upon reading this disclosure, additional inverters can be used as necessary to affect the transition from one logic system, e.g. positive logic system, to a negative logic system while still capitalizing on the utility of the novel floating gate driver transistors 901-1, 901-2, . . . , 901-N and T1–T6, having a low tunnel barrier intergate insulator between the control gate and floating gate in decode circuit 900. If the floating gate in a floating gate driver transistor is programmed with a negative charge on the floating gate it will not be active in the array and it is effectively removed from the array. In this manner the array logic functions can be programmed even when the circuit is in the final circuit or in the field and being used in a system. The field programmable, in service or in circuit programmable, logic devices described here work with much lower voltages than the normal devices used in current in field, or in service, programmable decode circuit technology due to tunneling of charge between the floating gate and control gate through the low-tunnel barrier intergate insulator. They can be programmed with Voltages of 2.0 to 4.0 Volts and the normal operating voltages on the vertical control gates can be of the order 1.0 Volt or so.

The absence of presence of stored charge on the floating gates is read by addressing the x-address or control gate lines and y-column/sourcelines to form a coincidence in address at a particular floating gate. The control gate line would for instance be driven positive at some voltage of 1.0 Volts and the y-column/sourceline grounded, if the floating gate is not charged with electrons then the floating transistor would turn on tending to hold the row or word address line on that particular row down indicating the presence of a stored "one" in the cell. If this particular floating gate is charged with stored electrons, the transistor will not turn on and the presence of a stored "zero" indicated in the cell. In this manner, data stored on a particular floating gate can be read.

In reality, data is read out in "bit pairs" by addressing not only a single floating gate but rather both of the floating gates in row adjacent pillars on each side of a particular control gate address line. Data is stored into the cell by hot electron injection or alternatively, according to the teachings of the present invention, by tunneling charge from the control gate to the floating gate through the low-tunnel barrier intergate insulator. Erasure is accomplished by driving the control gate line with a positive voltage and the sourceline, or backgate/substrate well address line, of the transistor with a negative bias so the total voltage difference is in the order of 2 Volts causing electrons to tunnel off of the floating gates and to the control gates. According to the teachings of the present invention, data can be erased in "bit pairs" since both floating gates on each side of a control gate can be erased at the same time. This architecture is amenable to block address schemes where sections of the array are erased and reset at the same time.

Figure 10:
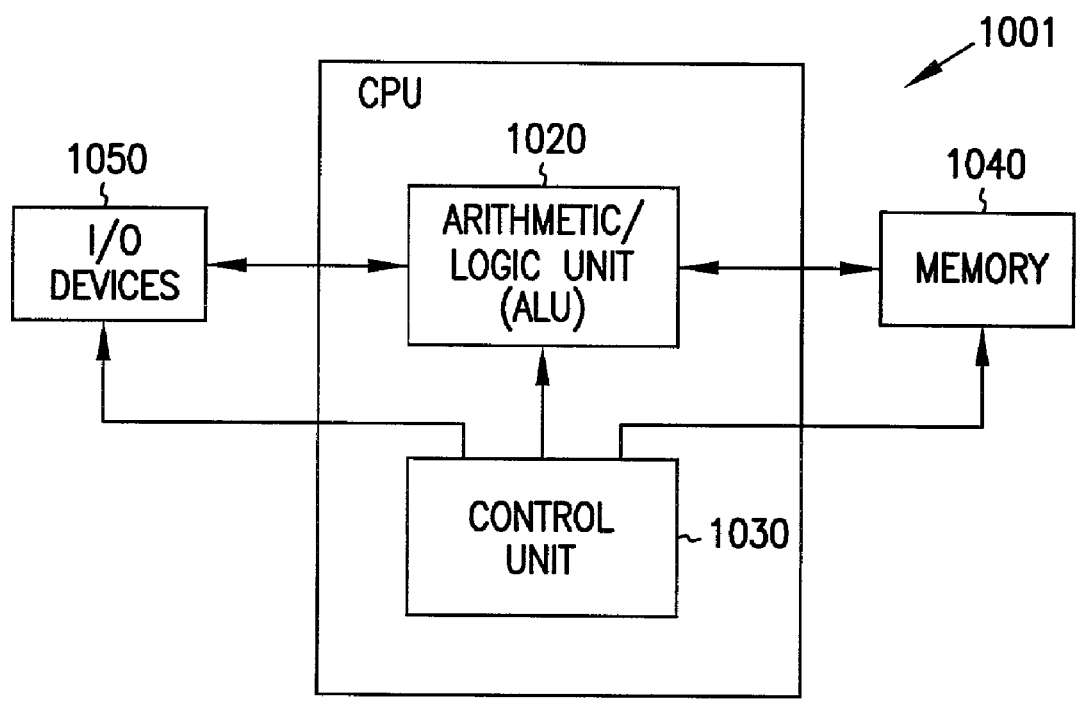
FIG. 10 is a simplified block diagram of a high-level organization of an electronic system according to the teachings of the present invention.

FIG. 10 is a simplified block diagram of a high-level organization of an electronic system 1001 according to the teachings of the present invention. As shown in FIG. 10, the electronic system 1001 is a system whose functional elements consist of an arithmetic/logic unit (ALU) 1020 or processor 1020, a control unit 1030, a memory device unit 1040 and an input/output (I/O) device 1050. Generally such an electronic system 1001 will have a native set of instructions that specify operations to be performed on data by the ALU 1020 and other interactions between the ALU 1020, the memory device unit 1040 and the I/O devices 1050. The memory device units 1040 contain the data plus a stored list of instructions.

The control unit 1030 coordinates all operations of the processor 1020, the memory device 1040 and the I/O devices 1050 by continuously cycling through a set of operations that cause instructions to be fetched from the memory device 1040 and executed. Memory device 1040 can be implemented with "in-service" programmable low voltage decode circuits, according to the teachings of the present invention, e.g., having a low-tunnel barrier intergate insulator between the control gate and floating gate. In addition, the decode circuits of the present invention can enable error correction by replacing a row, or column, in a memory array.

CONCLUSION

The above structures and fabrication methods have been described, by way of example and not by way of limitation, with respect to in service programmable logic arrays using non-volatile memory cells with low tunnel barrier interpoly insulators.

It has been shown that the low tunnel barrier interpoly insulators of the present invention avoid the large barriers to electron tunneling or hot electron injection presented by the silicon oxide-silicon interface, 3.2 eV, which result in slow write and erase speeds even at very high electric fields. The present invention also avoids the combination of very high electric fields and damage by hot electron collisions in the which oxide result in a number of operational problems like soft erase error, reliability problems of premature oxide breakdown and a limited number of cycles of write and erase. Further, the low tunnel barrier interpoly dielectric insulator erase approach, of the present invention remedies the above mentioned problems of having a rough top surface on the polysilicon floating gate which results in, poor quality interpoly oxides, sharp points, localized high electric fields, premature breakdown and reliability problems.

According to the teachings of the present invention, any arbitrary combinational logic function can be realized in the so-called sum-of-products form. A sum of products may be implemented by using a two level logic configuration such as the NOR-NOR arrays shown in FIG. 10, or by a combination of NOR gates and NAND gates. A NAND gate can be realized by a NOR gate with the inputs inverted. By programming the floating gates of the non-volatile memory cells in the array, these arrays can be field programmed or erased and reprogrammed to accomplish the required logic functions.

What is claimed is:

1. An electronic system, comprising:
   a processor; and
   a memory device coupled to processor, wherein the memory device includes a programmable decoder comprising:
      a number of address lines;
      a number of output lines;
      wherein the address lines, and the output lines form an array;
         a number of logic cells formed at the intersections of output lines and address lines, wherein each of the logic cells includes a vertical non-volatile memory cell including:
            a vertical pillar extending outwardly from a semiconductor substrate at intersections of the input lines and interconnect lines and at the intersections of the interconnect lines and the output lines, wherein each pillar includes a first source/drain region, a body region, and a second source/drain region;
            a number of floating gates opposing the body regions in the number of pillars and separated therefrom by a gate oxide;
            a number of control gates opposing the floating gates, wherein the number of control gates are separated from the number of floating gates by a low tunnel barrier intergate insulator;
         a number of buried source lines formed of single crystalline semiconductor material and disposed below the pillars in the array for interconnecting with the first source/drain regions of column adjacent pillars in the array.

2. The electronic system of claim 1, wherein the low tunnel barrier intergate insulator includes a metal oxide insulator selected from the group consisting of $PbO$, $Al_2O_3$, $Ta_2O_5$, $TiO_2$, $ZrO_2$, and $Nb_2O_5$.

3. The electronic system of claim 1, wherein each floating gate includes a polysilicon floating gate having a metal layer formed thereon in contact with the low tunnel barrier intergate insulator.

4. The electronic system of claim 3, wherein each control gate includes a polysilicon control gate having a metal layer formed thereon in contact with the low tunnel barrier intergate insulator.

5. The electronic system of claim 1, wherein each floating gate is a vertical floating gate formed in a trench below a top surface of each pillar such that each trench houses a pair of floating gates opposing the body regions in adjacent pillars on opposing sides of the trench.

6. The electronic system of claim 5, wherein the number of control gates are formed in the trench below the top surface of the pillar and between the pair of floating gates, wherein each pair of floating gates shares a single control gate, and wherein each floating gate includes a vertically oriented floating gate having a vertical length of less than 100 nanometers.

7. The electronic system of claim 5, wherein the number of control gates are formed in the trench below the top surface of the pillar and between the pair of floating gates such that each trench houses a pair of control gate lines each addressing the floating gates one on opposing sides of the trench respectively, and wherein the pair of control gate lines are separated by an insulator layer.

8. The electronic system of claim 5, wherein the number of control gates are disposed vertically above the floating gates, and wherein each pair of floating gates shares a single control gate.

9. The electronic system of claim 5, wherein the number of control gates are disposed vertically above the floating gates, and wherein each one of the pair of floating gates is addressed by an independent one of the number of control gates.

10. The electronic system of claim 1, wherein each floating gate is a horizontally oriented floating gate formed in a trench below a top surface of each pillar such that each trench houses a floating gate opposing the body regions in adjacent pillars on opposing sides of the trench, and wherein each horizontally oriented floating gate has a vertical length of less than 100 nanometers opposing the body region of the pillars.

11. The electronic system of claim 10, wherein the number of control gates are disposed vertically above the floating gates.

12. A method for forming an in service programmable logic array, comprising:
    forming a plurality of address lines;
    forming a plurality of output lines, wherein the plurality of output and address lines form an array; and
    forming a number of logic cells at the intersections of the output and address lines, wherein forming a number of logic cells includes forming a number of vertical non-volatile memory cells including:
        forming a vertical pillar extending outwardly from a semiconductor substrate at intersections of the input lines and interconnect lines and at the intersections of the interconnect lines and the output lines, wherein each pillar includes a first source/drain region, a body region, and a second source/drain region;
        forming a number of floating gates opposing the body regions in the number of pillars and separated therefrom by a gate oxide;
        forming a number of control gates opposing the floating gates; and
        forming a low tunnel barrier intergate insulator to separate the control gate from the floating gate; and
    forming a number of buried source lines formed of single crystalline semiconductor material and disposed below the pillars in the array for interconnecting with the first source/drain regions of colunm adjacent pillars in the array.

13. The method of claim 12, wherein forming the low tunnel barrier intergate insulator includes forming a metal oxide insulator selected from the group consisting of PbO, $Al_2O_3$, $Ta_2O_5$, $TiO_2$, $ZrO_2$, and $Nb_2O_5$.

14. The method of claim 12, wherein forming each floating gate includes forming a polysilicon floating gate having a metal layer formed thereon in contact with the low tunnel bamer intergate insulator.

15. The method of claim 12, wherein forming each control gate includes forming a polysilicon control gate having a metal layer formed thereon in contact with the low tunnel barrier intergate insulator.

16. The method of claim 12, wherein forming each floating gate includes forming a vertical floating gate formed in a trench below a top surface of each pillar such that each trench houses a pair of floating gates opposing the body regions in adjacent pillars on opposing sides of the trench.

17. The method of claim 16, wherein forming the number of control gates includes forming the control gates in the trench below the top surface of the pillar and between the pair of floating gates, wherein each pair of floating gates shares a single control gate line, and wherein each floating gate includes a vertically oriented floating gate having a vertical length of less than 100 nanometers.

18. The method of claim 16, wherein forming the number of control gates includes forming the control gates in the trench below the top surface of the pillar and between the pair of floating gates such that each trench houses a pair of control gates each addressing the floating gates one on opposing sides of the trench respectively, and wherein the pair of control gates are separated by an insulator layer.

19. The method of claim 16, wherein forming the number of control gates includes forming the control gates disposed vertically above the floating gates, and wherein each pair of floating gates shares a single control gate.

20. The method of claim 16, wherein forming the number of control gates includes forming the control gates disposed vertically above the floating gates, and wherein each one of the pair of floating gates is addressed by an independent one of the number of control gates.

21. The method of claim 12, wherein forming each floating gate includes forming a horizontally oriented floating gate formed in a trench below a top surface of each pillar such that each trench houses a floating gate opposing the body regions in adjacent pillars on opposing sides of the trench, and wherein each horizontally oriented floating gate has a vertical length of less than 100 nanometers opposing the body region of the pillars.

22. The method of claim 21, wherein forming the number of control gates includes forming the control gates disposed vertically above the floating gates.

23. An electronic system, comprising:
    a processor; and
    a memory device coupled to processor, wherein the memory device includes a programmable decoder comprising:
        a number of address lines;
        a number of output lines;
        wherein the address lines, and the output lines form an array;
        a number of logic cells formed at the intersections of output lines and address lines, wherein a logic cell includes a vertical non-volatile memory cell including:
            a vertical pillar extending outwardly from a semiconductor substrate at intersections of the input lines and interconnect lines and at the intersections of the interconnect lines and the output lines, wherein each pillar includes a first source/drain region, a body region, and a second source/drain region;
            a number of floating gates opposing the body regions in the number of pillars and separated therefrom by a gate oxide, wherein the floating gates include a polysilicon layer and a metal layer;

a number of control gates opposing the floating gates, wherein the number of control gates are separated from the number of floating gates by a low tunnel barrier, metal oxide intergate insulator, wherein the intergate insulator contacts the metal layer of the floating gate;

a number of buried source lines formed of single crystalline semiconductor material and disposed below the pillars in the array for interconnecting with the first source/drain regions of column adjacent pillars in the array.

24. The electronic system of claim 23, wherein the low tunnel barrier, metal oxide intergate insulator includes a metal oxide insulator selected from the group consisting of PbO, $Al_2O_3$, $Ta_2O_5$, $TiO_2$, $ZrO_2$, and $Nb_2O_5$.

25. The electronic system of claim 23, wherein each control gatei ncludes a polysilicon layer and a metal layer, the metal layer being in contact with the low tunnel barrier, metal oxide intergate insulator.

26. An electronic system, comprising:

a processor; and a memory device coupled to processor, wherein the memory device includes a programmable decoder comprising:

a number of address lines;

a number of output lines;

wherein the address lines, and the output lines form an array;

a number of logic cells formed at the intersections of output lines and address lines, wherein a logic cell includes a vertical non-volatile memory cell including:

a vertical pillar extending outwardly from a semiconductor substrate at intersections of the input lines and interconnect lines and at the intersections of the interconnect lines and the output lines, wherein each pillar includes a first source/drain region, a body region, and a second source/drain region;

a number of floating gates opposing the body regions in the number of pillars and separated therefrom by a gate oxide, wherein one floating gate includes a vertically oriented floating gate having a vertical length of less than 100 nanometers;

a number of control gates opposing the floating gates, wherein the number of control gates are separated from the number of floating gates by a low tunnel barrier intergate insulator;

a number of buried source lines formed of single crystalline semiconductor material and disposed below the pillars in the array for interconnecting with the first source/drain regions of column adjacent pillars in the array.

27. The electronic system of claim 26, wherein each of the floating gates includes a vertically oriented floating gate having a vertical length of less than 100 nanometers.

28. The electronic system of claim 26, wherein the low tunnel barrier intergate insulator includes a metal oxide insulator selected from the group consisting of PbO, $Al_2O_3$, $Ta_2O_5$, $TiO_2$, $ZrO_2$, and $Nb_2O_5$.

29. A method for forming an in service programmable logic array, comprising:

forming a plurality of address lines;

forming a plurality of output lines, wherein the plurality of output and address lines form an array; and forming a number of logic cells at the intersections of the output and address lines, wherein forming a number of logic cells includes forming a number of vertical non-volatile memory cells including:

forming a vertical pillar extending outwardly from a semiconductor substrate at intersections of the input lines and interconnect lines and at the intersections of the interconnect lines and the output lines, wherein each pillar includes a first source/drain region, a body region, and a second source/drain region;

forming a number of floating gates opposing the body regions in the number of pillars and separated therefrom by a gate oxide, wherein forming the number of floating gates includes forming a polysilicon layer and a metal layer;

forming a number of control gates opposing the floating gates; and forming a low tunnel barrier intergate insulator to separate the control gate from the floating gate and to contact the metal layer of the number of floating gates;

forming a number of buried source lines formed of single crystalline semiconductor material and disposed below the pillars in the array for interconnecting with the first source/drain regions of column adjacent pillars in the array.

30. The method of claim 29, wherein forming the low tunnel barrier intergate insulator includes forming a metal oxide insulator selected from the group consisting of PbO, $Al_2O_3$, $Ta_2O_5$, $TiO_2$, $ZrO_2$, and $Nb_2O_5$.

31. The method of claim 29, wherein forming the number of floating gates includes forming a vertically oriented floating gate having a dimension of less than 100 nanometers.

* * * * *

UNITED STATES PATENT AND TRADEMARK OFFICE
CERTIFICATE OF CORRECTION

| | | |
|---|---|---|
| PATENT NO. | : 7,075,829 B2 | Page 1 of 2 |
| APPLICATION NO. | : 09/945500 | |
| DATED | : July 11, 2006 | |
| INVENTOR(S) | : Forbes | |

It is certified that error appears in the above-identified patent and that said Letters Patent is hereby corrected as shown below:

On page 2, in field (56), under "U.S. Patent Documents", in column 2, line 10, delete "6,566,682 B1" and insert -- 6,566,682 B2 --, therefor.

On page 2, in field (56), under "U.S. Patent Documents", in column 2, line 16, delete "6,903,367 B1" and insert -- 6,903,367 B2 --, therefor.

On page 3, in field (56), under "Other Publications", in column 1, line 4, delete "Young" and insert -- Yong --, therefor.

On page 3, in field (56), under "Other Publications", in column 1, line 18, delete "TiO2 fromTiI4and H2O-H2O2" and insert -- $TiO_2$ from $TiI_4$ and $H_2O$-$H_2O_2$ --, therefor.

On page 3, in field (56), under "Other Publications", in column 1, line 36, delete "Surgace" and insert -- Surface --, therefor.

In column 2, line 61, delete "interploy" and insert -- interpoly --, therefor.

In column 10, line 25, delete "6003," and insert -- 600-3, --, therefor.

In column 13, lines 26-27, delete "Meal-Oxide-Metal system" and insert -- Metal-Oxide-Metal system --, therefor.

In column 13, line 61, delete "Meal-Oxide-Metal system" and insert -- Metal-Oxide-Metal system --, therefor.

In column 14, lines 3-4, delete "Meal-Oxide-Metal system" and insert -- Metal-Oxide-Metal system --, therefor.

In column 19, line 28, delete "A1 through A3." and insert -- $\overline{A1}$ through $\overline{A3}$. --, therefor.

In column 20, line 58, delete "9011," and insert -- 901-1, --, therefor.

In column 25, line 58, in Claim 12, delete "colunm" and insert -- column --, therefor.

In column 25, line 67, in Claim 14, delete "bamer" and insert -- barrier --, therefor.

UNITED STATES PATENT AND TRADEMARK OFFICE
CERTIFICATE OF CORRECTION

PATENT NO. : 7,075,829 B2
APPLICATION NO. : 09/945500
DATED : July 11, 2006
INVENTOR(S) : Forbes It is certified that error appears in the above-identified patent and that said Letters Patent is hereby corrected as shown below:

In column 27, line 20, in Claim 25, delete "gatei ncludes" and insert -- gate includes --, therefor.

Signed and Sealed this

Seventh Day of November, 2006

JON W. DUDAS
*Director of the United States Patent and Trademark Office*